United States Patent
Konyuba et al.

(10) Patent No.: US 11,037,755 B2
(45) Date of Patent: Jun. 15, 2021

(54) OBSERVATION METHOD, SPECIMEN SUPPORT, AND TRANSMISSION ELECTRON MICROSCOPE

(71) Applicant: JEOL Ltd., Tokyo (JP)

(72) Inventors: Yuji Konyuba, Tokyo (JP); Yuta Ikeda, Tokyo (JP); Tomohiro Haruta, Tokyo (JP); Tomohisa Fukuda, Tokyo (JP)

(73) Assignee: JEOL Ltd., Tokyo (JP)

(*) Notice: Subject to any disclaimer, the term of this patent is extended or adjusted under 35 U.S.C. 154(b) by 0 days.

(21) Appl. No.: 16/410,243

(22) Filed: May 13, 2019

(65) Prior Publication Data
US 2019/0348253 A1    Nov. 14, 2019

(30) Foreign Application Priority Data

May 14, 2018 (JP) .............................. JP2018-092852

(51) Int. Cl.
*H01J 37/20* (2006.01)
*H01J 37/28* (2006.01)
*H01J 37/244* (2006.01)

(52) U.S. Cl.
CPC .......... *H01J 37/20* (2013.01); *H01J 37/244* (2013.01); *H01J 37/28* (2013.01)

(58) Field of Classification Search
CPC ........ H01J 37/20; H01J 37/244; H01J 37/28; H01J 37/202; H01J 37/20207; H01J 37/20214
See application file for complete search history.

(56) References Cited

U.S. PATENT DOCUMENTS

| | | | | |
|---|---|---|---|---|
| 8,395,130 B2 * | 3/2013 | Gächter | ................. | H01J 37/20 250/440.11 |
| 9,349,569 B2 * | 5/2016 | Ishikawa | ................. | H01J 37/26 |
| 9,558,910 B2 | 1/2017 | Terada et al. | | |

(Continued)

FOREIGN PATENT DOCUMENTS

| | | |
|---|---|---|
| DE | 112012005295 T5 | 9/2014 |
| JP | 200926300 A | 2/2009 |

(Continued)

OTHER PUBLICATIONS

"Shuttle & Find for ZEN Imaging Software Speed Up Your Correlative Workflow", Carl Zeiss Microscopy GmbH, https://applications.zeiss.com/C125792900358A3F/0/62414EAA22FB548BC1257B94004AC559/$FILE/EN_41_011_041_Shuttle_Find.pdf.

(Continued)

*Primary Examiner* — David E Smith
(74) *Attorney, Agent, or Firm* — The Webb Law Firm

(57) ABSTRACT

An observation method includes placing a specimen on a specimen supporting film of a specimen support, attaching the specimen support to a retainer, attaching the retainer to an optical microscope retainer holding base, attaching the optical microscope retainer holding base to a specimen stage of an optical microscope and observing the specimen under the optical microscope, attaching the retainer to a transmission electron microscope retainer holding base, and loading the transmission electron microscope retainer holding base into a transmission electron microscope and observing the specimen under the transmission electron microscope.

16 Claims, 20 Drawing Sheets

(56) References Cited

U.S. PATENT DOCUMENTS

| | | | | |
|---|---|---|---|---|
| 2005/0269495 | A1* | 12/2005 | Kakemizu | H01J 3/14 250/234 |
| 2006/0289784 | A1* | 12/2006 | Deguchi | G01N 23/06 250/441.11 |
| 2009/0039285 | A1* | 2/2009 | Cooper | H01J 37/20 250/442.11 |
| 2010/0006771 | A1* | 1/2010 | Miyazaki | H01J 37/20 250/442.11 |
| 2010/0320396 | A1* | 12/2010 | Terada | H01J 37/26 250/441.11 |
| 2012/0126115 | A1* | 5/2012 | Heise | G02B 21/34 250/307 |
| 2014/0158907 | A1* | 6/2014 | Hamochi | H01J 37/20 250/442.11 |
| 2014/0268321 | A1* | 9/2014 | Damiano, Jr. | G02B 21/34 359/391 |
| 2015/0118126 | A1 | 4/2015 | Khalid et al. | |
| 2015/0259785 | A1 | 9/2015 | Konyuba | |
| 2016/0042912 | A1* | 2/2016 | Adiga | H01J 37/26 250/440.11 |
| 2017/0160532 | A1* | 6/2017 | Thomas | G02B 21/34 |
| 2018/0088306 | A1* | 3/2018 | Suzuki | G02B 21/365 |
| 2018/0166247 | A1* | 6/2018 | Moore | H01J 37/02 |

FOREIGN PATENT DOCUMENTS

| | | | |
|---|---|---|---|
| JP | 2012109171 A | 6/2012 | |
| JP | 20138633 A | 1/2013 | |
| JP | 2015187974 A | 10/2015 | |
| JP | 201855924 A | 4/2018 | |
| WO | 2014160061 A2 | 10/2014 | |
| WO | WO-2019217873 A1 * | 11/2019 | ............. H01J 37/20 |

OTHER PUBLICATIONS

Ring et al., Silicon nitride windows for electron microscopy of whole cells, Journal of Microscopy, Nov. 12, 2010, vol. 243, pp. 273-283.
Elisabeth Ariel Ring, "Design and Characterization of a Microfluidic System for Scanning Transmission Electron Microscopy", Aug. 2010, Thesis submitted to the faculty of the graduate school of Vanderbilt University, http://etd.library.vanderbilt.edu/available/etd-06282010-172313/unrestricted/Ring_Thesis_Submit.pdf.
Extended European Search Report issued in EP19174207.1 dated Oct. 10, 2019.
Office Action issued in JP2018-092852 dated Nov. 10, 2020.
Office Action issued in EP19174207.1 dated Mar. 1, 2021.

* cited by examiner

OBSERVATION METHOD, SPECIMEN SUPPORT, AND TRANSMISSION ELECTRON MICROSCOPE

CROSS-REFERENCE TO RELATED APPLICATION

This application claims priority to Japanese Patent Application No. 2018-092852 filed May 14, 2018, the disclosure of which is hereby incorporated by reference in its entirety.

BACKGROUND OF THE INVENTION

Field of the Invention

The present invention relates to an observation method, a specimen support, and a transmission electron microscope.

Description of Related Art

Correlative light and electron microscopy, in which a common specimen holder is used by both an optical microscope and a scanning electron microscope so that a region observed under the optical microscope can also be observed under the scanning electron microscope, is well-known (for example, see JP-A-2012-109171).

Although examples in which the same specimen can be observed under an optical microscope and a scanning electron microscope are known, as described above, no examples in which the same specimen can be observed under an optical microscope and a transmission electron microscope are known.

SUMMARY OF THE INVENTION

The invention can provide an observation method with which the same specimen can be observed easily under an optical microscope and a transmission electron microscope. Further, the invention can provide a specimen support and a transmission electron microscope used in this observation method.

According to a first aspect of the invention, there is provided an observation method including:
placing a specimen on a specimen supporting film of a specimen support;
attaching the specimen support to a retainer;
attaching the retainer to an optical microscope retainer holding base;
attaching the optical microscope retainer holding base to a specimen stage of an optical microscope and observing the specimen under the optical microscope;
attaching the retainer to a transmission electron microscope retainer holding base; and
loading the transmission electron microscope retainer holding base into a transmission electron microscope and observing the specimen under the transmission electron microscope.

According to a second aspect of the invention, there is provided a specimen support for supporting a specimen when a same specimen is observed under an optical microscope and a transmission electron microscope, the specimen support including:
a substrate provided with a through hole;
a specimen supporting film supported by the substrate and formed of a silicon nitride film or a carbon film; and
a fiducial marker provided in a region of the specimen supporting film that covers the through hole, the fiducial marker being observable under the optical microscope and the transmission electron microscope.

According to a third aspect of the invention, there is provided a transmission electron microscope used when a same specimen is observed under an optical microscope and the transmission electron microscope, the transmission electron microscope including:
a specimen holder that has a first moving mechanism for moving the specimen;
a second moving mechanism that moves the specimen by moving the specimen holder; and
a control unit that controls the first moving mechanism and the second moving mechanism,
the first moving mechanism moving the specimen along a first axis;
the second moving mechanism moving the specimen along the first axis and a second axis that is orthogonal to the first axis; and
the control unit specifying position coordinates of the specimen under the transmission electron microscope based on an amount by which the first moving mechanism moves the specimen and an amount by which the second moving mechanism moves the specimen.

DESCRIPTION OF THE INVENTION

Figure 1:
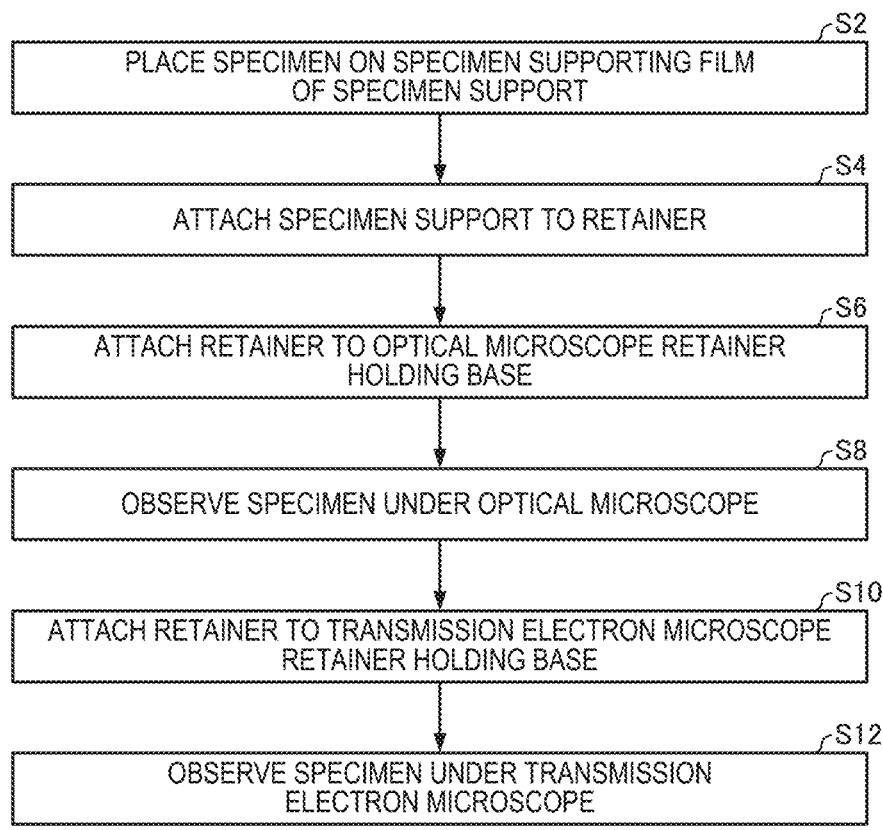
FIG. 1 is a flowchart illustrating an example of an observation method according to one embodiment of the invention.

According to one embodiment of the invention, there is provided an observation method including:

placing a specimen on a specimen supporting film of a specimen support;

attaching the specimen support to a retainer;

attaching the retainer to an optical microscope retainer holding base;

attaching the optical microscope retainer holding base to a specimen stage of an optical microscope and observing the specimen under the optical microscope;

attaching the retainer to a transmission electron microscope retainer holding base; and loading the transmission electron microscope retainer holding base into a transmission electron microscope and observing the specimen under the transmission electron microscope.

In this observation method, the retainer, the optical microscope retainer holding base, and the transmission electron microscope retainer holding base are used, and therefore, when the specimen support is attached to the retainer, the specimen can be observed under the optical microscope and the transmission electron microscope without directly contacting the specimen and the specimen support. As a result, the same specimen can be observed easily under the optical microscope and the transmission electron microscope.

According to one embodiment of the invention, there is provided a specimen support for supporting a specimen when a same specimen is observed under an optical microscope and a transmission electron microscope, the specimen support including:

a substrate provided with a through hole;

a specimen supporting film supported by the substrate and formed of a silicon nitride film or a carbon film; and a fiducial marker provided in a region of the specimen supporting film that covers the through hole, fiducial marker being observable under the optical microscope and the transmission electron microscope.

This specimen support includes the fiducial marker, and therefore a coordinate system of the optical microscope and a coordinate system of the transmission electron microscope can be associated easily.

According to one embodiment of the invention, there is provided a specimen holding tool set used when a same specimen is observed under an optical microscope and a transmission electron microscope, the specimen holding tool set including:

a retainer that holds a specimen support supporting a specimen;

an optical microscope retainer holding base that holds the retainer and can be attached to a specimen stage of the optical microscope; and a transmission electron microscope retainer holding base that holds the retainer and can be loaded into the transmission electron microscope.

With this specimen holding tool set, when the specimen support is attached to the retainer, the specimen can be observed under the optical microscope and the transmission electron microscope without directly contacting the specimen and the specimen support.

According to one embodiment of the invention, there is provided a transmission electron microscope used when a same specimen is observed under an optical microscope and the transmission electron microscope, the transmission electron microscope including:

a specimen holder that has a first moving mechanism for moving the specimen;

a second moving mechanism that moves the specimen by moving the specimen holder; and a control unit that controls the first moving mechanism and the second moving mechanism, the first moving mechanism moving the specimen along a first axis;

the second moving mechanism moving the specimen along the first axis and a second axis that is orthogonal to the first axis; and the control unit specifying position coordinates of the specimen under the transmission electron microscope based on an amount by which the first moving mechanism moves the specimen and an amount by which the second moving mechanism moves the specimen.

The transmission electron microscope includes the first moving mechanism and the second moving mechanism, and as a result, the observable region of the specimen can be enlarged. With this transmission electron microscope, therefore, a comparatively large specimen serving as an observation subject can also be observed under an optical microscope, which is effective when the same specimen is observed under an optical microscope and a transmission electron microscope.

Embodiments of the invention are described in detail below with reference to the drawings. Note that the following embodiments do not unduly limit the scope of the invention as stated in the claims. In addition, all of the elements described in connection with the following embodiments should not necessarily be taken as essential requirements of the invention.

1. Observation Method

First, an observation method according to one embodiment of the invention will be described with reference to the figures. The observation method according to one embodiment of the invention is an observation method for observing the same specimen under an optical microscope and a transmission electron microscope. FIG. 1 is a flowchart illustrating an example of the observation method according to one embodiment of the invention.

As illustrated in FIG. 1, the observation method according to this embodiment includes a step S2 for placing a specimen on a specimen supporting film of a specimen support, a step S4 for attaching the specimen support to a retainer, a step S6 for attaching the retainer to an optical microscope retainer holding base, a step S8 for attaching the optical microscope retainer holding base to a specimen stage of an optical microscope and observing the specimen under the optical microscope, a step S10 for attaching the retainer to a transmission electron microscope retainer holding base, and a step S12 for loading the transmission electron microscope retainer holding base into a transmission electron microscope and observing the specimen under the transmission electron microscope.

The observation method according to this embodiment will be described in detail below.

1.1. Placing Specimen on Specimen Support

First, a specimen is placed on a specimen supporting film of a specimen support. The specimen support used in the observation method according to this embodiment will be described below.

1.1.1. Specimen Support

Figure 2:
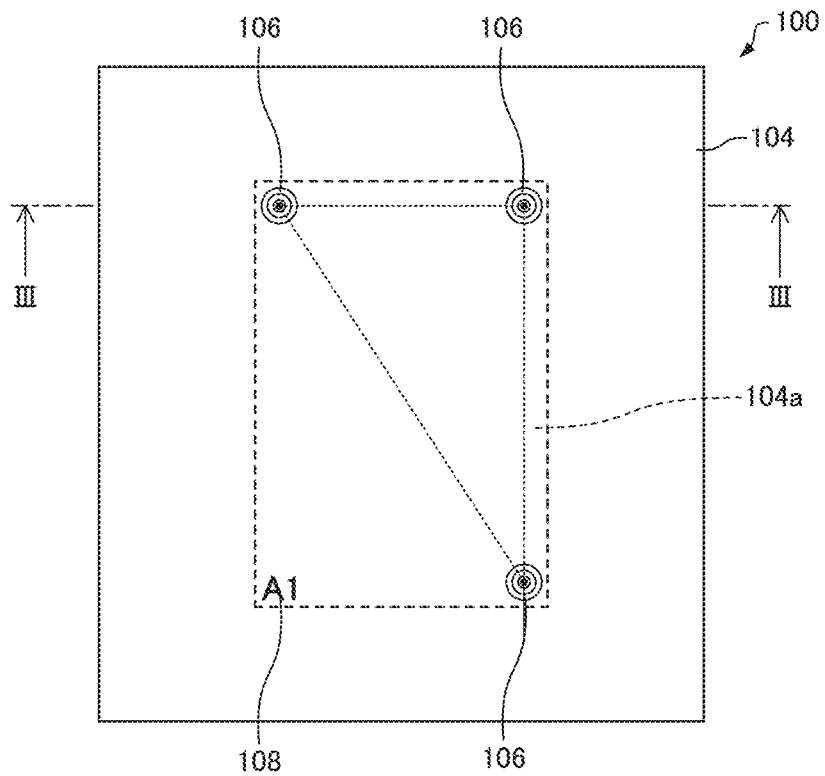
FIG. 2 is a schematic plan view of a specimen support.
Figure 3:
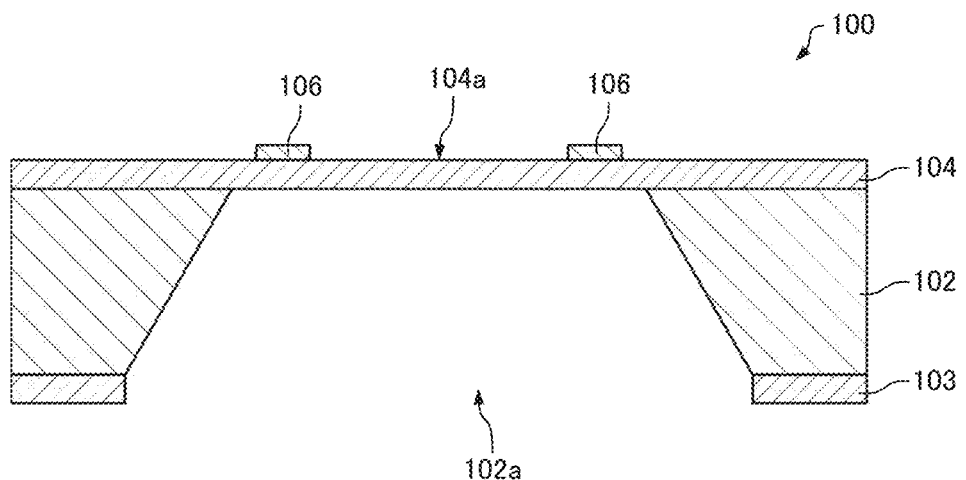
FIG. 3 is a schematic sectional view of the specimen support.

FIG. 2 is a schematic plan view of a specimen support 100. FIG. 3 is a schematic sectional view of the specimen support 100.

As illustrated in FIGS. 2 and 3, the specimen support 100 includes a substrate 102, a specimen supporting film 104, fiducial markers 106, and an identification marker 108. Note that for convenience, FIGS. 2 and 3 illustrate the fiducial markers 106 in simplified form.

The substrate 102 is a silicon substrate, for example. Note that various types of substrates, such as a ceramic substrate, a glass substrate, a sapphire substrate, or a synthetic resin substrate, may be used as the substrate 102. The thickness of the substrate 102 is no less than 100 μm and no more than 200 μm, for example. A through hole 102a is provided in the substrate 102. The planar shape of the substrate 102 (the shape of the substrate 102 when seen from the thickness direction) is rectangular, for example. A mask layer 103 that serves as a mask when forming the through hole 102a is provided on a surface of the substrate 102 on the opposite side to a surface on which the specimen supporting film 104 is provided.

The specimen supporting film 104 is supported by the substrate 102. The specimen supporting film 104 is a silicon nitride (SiN) film, for example. Note that a carbon film may also be used as the specimen supporting film 104. The film thickness of the specimen supporting film 104 is approximately several tens of nm, for example.

The specimen supporting film 104 includes a thin film region 104a that can be observed by a transmission electron microscope. The thin film region 104a is a region that does not cover the substrate 102, or in other words a region that covers the through hole 102a, when seen from the thickness direction of the substrate 102 (in other words, when seen from an incidence direction of an electron beam). In the example illustrated in the figures, the planar shape of the thin film region 104a is rectangular. The length of one side of the thin film region 104a is approximately several hundred μm to several moving mechanism, for example. Note that there are no specific limitations on the planar shape of the thin film region 104a. In the specimen support 100, a specimen is disposed in the thin film region 104a.

The fiducial markers 106 are provided in the thin film region 104a. The fiducial markers 106 are provided in the thin film region 104a in a plurality. In the example illustrated in the figures, three fiducial markers 106 are provided. The three fiducial markers 106 are disposed near three of the four corners of the rectangular thin film region 104a. A figure formed by connecting respective centers of the three fiducial markers 106 with straight lines is a right-angled triangle, for example. Note that the arrangement of the fiducial markers 106 is not limited to the example illustrated in the figures. As will be described below, the fiducial markers 106 are used to associate a coordinate system of an optical microscope with a coordinate system of a transmission electron microscope.

The identification marker 108 is provided in the thin film region 104a. The identification marker 108 is used to identify the specimen support 100. Although not illustrated in the figures, the identification marker 108 may be provided in a region of the specimen supporting film 104 that covers the substrate 102. The identification marker 108 may be alphanumeric characters, a figure, or a combination thereof, for example.

The material of the fiducial markers 106 and the identification marker 108 is metal, for example, and preferably precious metal. Precious metal exhibits high reflectance to visible light. Therefore, by forming the fiducial markers 106 and the identification marker 108 from precious metal, the fiducial markers 106 and the identification marker 108 can be confirmed easily under an optical microscope. The fiducial markers 106 and the identification marker 108 are formed by, for example, laminating chrome and gold, in that order, from the specimen supporting film 104 side.

Figure 4:
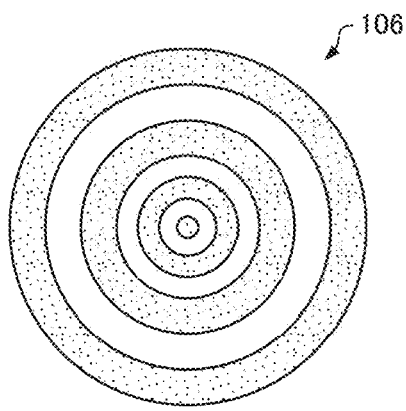
FIG. 4 is a schematic plan view of a fiducial marker.

FIG. 4 is a schematic plan view of the fiducial marker 106.

The fiducial marker 106 can be observed under both an optical microscope and a transmission electron microscope. The fiducial marker 106 is provided in the thin film region 104a and can therefore be observed under a transmission electron microscope.

The fiducial marker 106 has a shape in which a plurality of similar figures are arranged concentrically. In the example illustrated in FIG. 4, the fiducial marker 106 has a shape in which four circles are arranged concentrically. Note that there are no specific limitations on the number of circles forming the fiducial marker 106.

Here, a large difference exists between the observation magnification of an optical microscope and the observation magnification of a transmission electron microscope. When the fiducial marker 106 has a shape in which a plurality of similar figures are arranged concentrically, a center position of the fiducial marker can be specified easily at both a low observation magnification and a high observation magnification. Therefore, by forming the fiducial marker 106 to have a shape in which a plurality of similar figures are arranged concentrically, the center position of the fiducial marker 106 can be specified easily under both an optical microscope and a transmission electron microscope.

Figure 5:
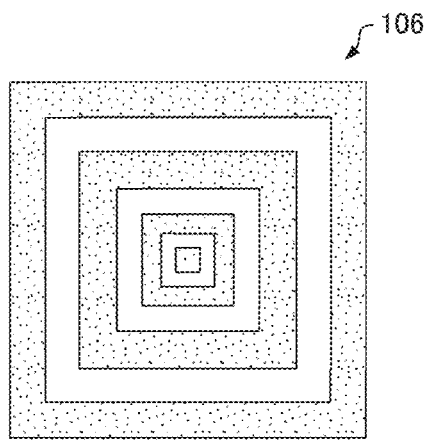
FIG. 5 is a schematic plan view illustrating a modified example of the fiducial marker.
Figure 6:
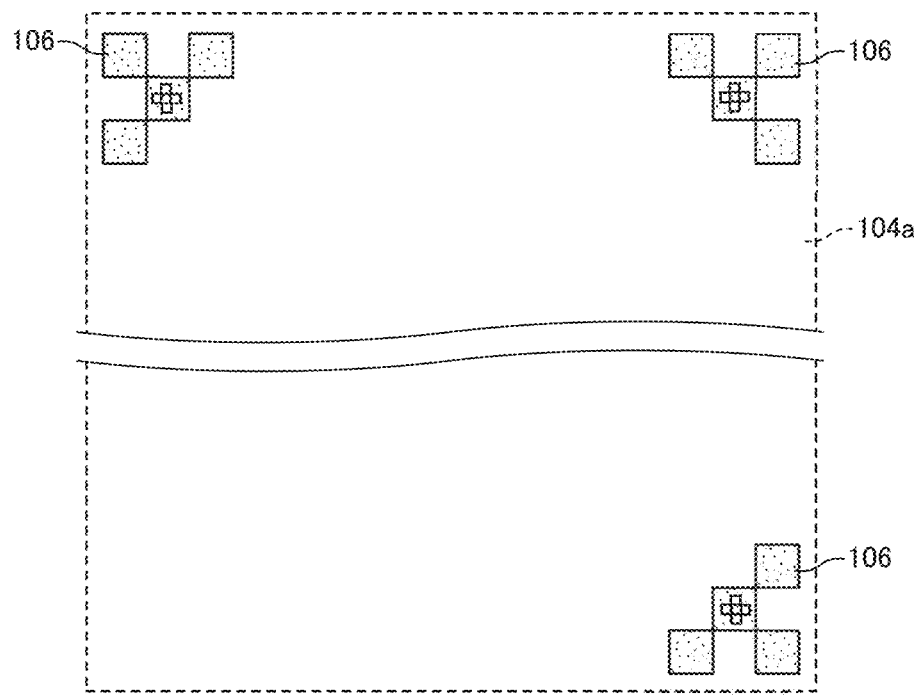
FIG. 6 is a schematic plan view illustrating a modified example of the fiducial marker.

FIGS. 5 and 6 are schematic plan views illustrating modified examples of the fiducial marker 106.

As illustrated in FIG. 5, the fiducial marker 106 may have a shape in which four rectangles are arranged concentrically. Further, as illustrated in FIG. 6, the plurality of fiducial markers 106 may have identical shapes but be disposed in different orientations. In so doing, the plurality of fiducial markers 106 can be distinguished easily. Although not shown in the figures, the plurality of fiducial markers 106 may also be distinguished easily by forming the plurality of fiducial markers in different shapes.

The specimen support 100 has the following features, for example.

The specimen support 100 is a specimen support for supporting a specimen when the same specimen is observed under an optical microscope and a transmission electron microscope, and includes the substrate 102 provided with the through hole 102a, the specimen supporting film 104 supported by the substrate 102 and formed of a silicon nitride film or a carbon film, and the fiducial marker 106 provided in a region (the thin film region 104a) of the specimen supporting film 104 that covers the through hole 102a, fiducial marker 106 being observable under the optical microscope and the transmission electron microscope. By including the fiducial marker 106 in the specimen support 100 in this manner, the coordinate system of the optical microscope and the coordinate system of the transmission electron microscope can be associated easily, as will be described below.

In the specimen support 100, the fiducial marker 106 has a shape in which a plurality of similar figures are arranged concentrically. Hence, the center position of the fiducial marker 106 can be specified easily under both an optical microscope and a transmission electron microscope. As a result, the coordinate system of the optical microscope and the coordinate system of the transmission electron microscope can be associated easily.

In the specimen support 100, as illustrated in FIG. 2, three fiducial markers 106 are provided, and the figure formed by connecting the respective centers of the three fiducial markers 106 with straight lines is a right-angled triangle. In the specimen support 100, therefore, the three fiducial markers 106 can be distinguished easily. Hence, the two axes forming a coordinate system can be specified easily, and as a result, the coordinate system of the optical microscope and the coordinate system of the transmission electron microscope can be associated easily.

In the specimen support 100, as illustrated in FIG. 6, the fiducial marker 106 is provided in a plurality, and the plurality of fiducial markers 106 have the same shape but are disposed in different orientations. In the specimen support 100, therefore, the three fiducial markers 106 can be distinguished easily.

The specimen support 100 is formed using a manufacturing method to be described below, and therefore internal stress in the specimen supporting film 104 can be realized as tension. As a result, the surface area of the thin film region 104a can be enlarged. With the specimen support 100, therefore, a large specimen can be observed under a transmission electron microscope. For example, by setting one side of the thin film region 104a in the order of millimeters, a large specimen serving as an observation subject can also be supported by an optical microscope. Moreover, a larger number of continuous sections, for example, can be disposed in the thin film region 104a, and as a result, a three-dimensional image of a larger region can be generated easily.

1.1.2. Manufacturing Method for Specimen Support

Figure 7:
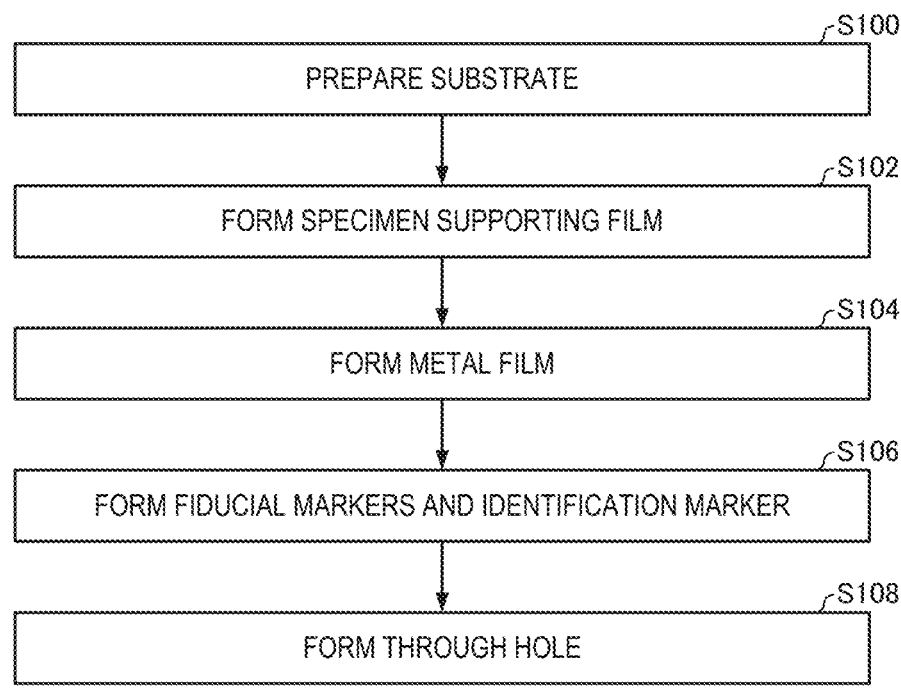
FIG. 7 is a flowchart illustrating a method for manufacturing the specimen support.
Figure 8:
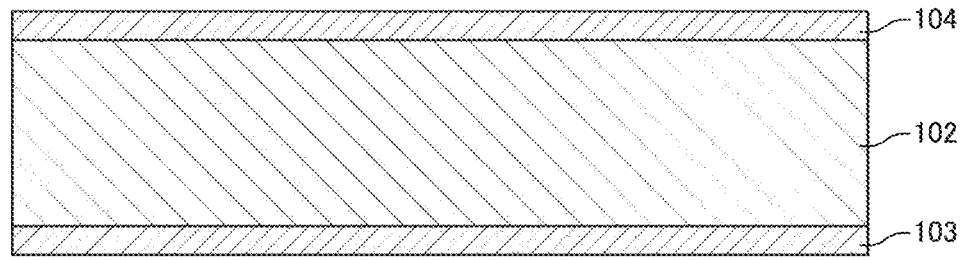
FIG. 8 is a schematic sectional view illustrating a process for manufacturing the specimen support.
Figure 9:
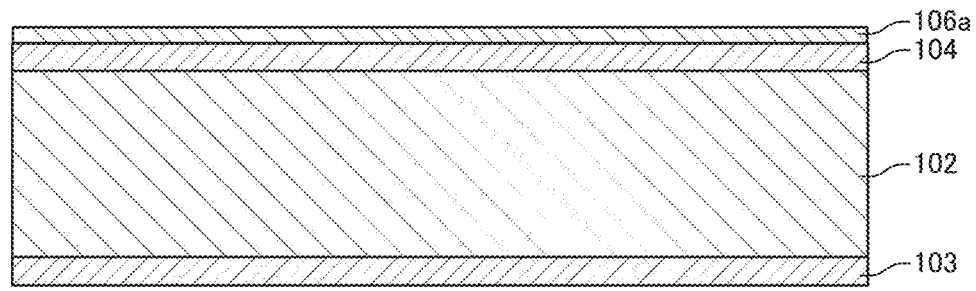
FIG. 9 is a schematic sectional view illustrating a process for manufacturing the specimen support.
Figure 10:
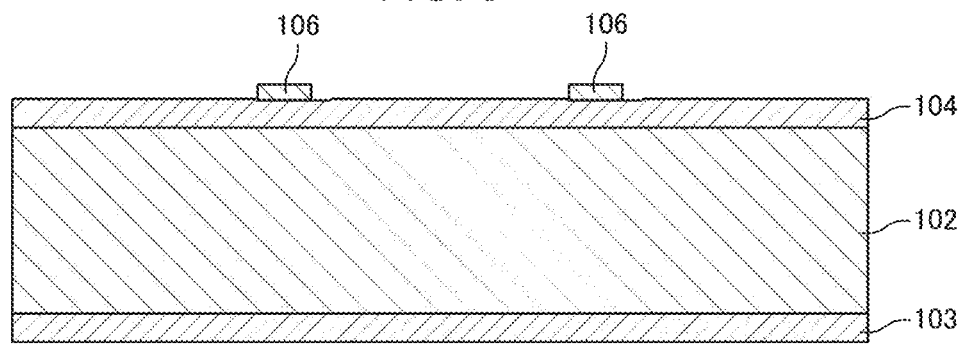
FIG. 10 is a schematic sectional view illustrating a process for manufacturing the specimen support.

FIG. 7 is a flowchart illustrating an example of a method for manufacturing the specimen support 100. FIGS. 8-10 are schematic sectional views illustrating processes for manufacturing the specimen support 100.

First, as illustrated in FIG. 8, the substrate 102 is prepared (S100).

Next, the specimen supporting film 104 is formed on an upper surface of the substrate 102 and the mask layer 103 is formed on a lower surface of the substrate 102 by forming silicon nitride films on the upper and lower surfaces of the substrate 102 (S102).

The silicon nitride film is formed by physical vapor deposition such as vacuum deposition or sputtering, chemical vapor deposition (CVD), or the like, for example. Note that by depositing the silicon nitride film using low pressure chemical vapor deposition (LP-CVD), internal stress in the silicon nitride film can be realized as tension. As a result, the thin film region 104a can be formed with a large surface area.

Note that when a carbon film is used as the specimen supporting film 104, the carbon film is formed by vacuum deposition, sputtering, or the like, for example.

Next, as illustrated in FIG. 9, a metal film 106a is formed on the specimen supporting film 104 (S104). The metal film 106a is formed using physical vapor deposition such as vacuum deposition or sputtering, for example.

Next, as illustrated in FIG. 10, the fiducial markers 106 and the identification marker 108 (see FIG. 2) are formed by patterning the metal film 106a (S106).

Although not shown in the figures, a mask is formed by coating the metal film 106a with resist and patterning the resist by lithography, for example. By performing the lithography using a laser drawing device, an electron beam drawing device, or the like, the fiducial markers 106 and the identification marker 108 can be formed precisely. Next, the metal film 106a is etched using the mask. Thus, the fiducial markers 106 and the identification marker 108 can be formed.

Next, as illustrated in FIG. 3, the through hole 102a penetrating the substrate 102 is formed by etching the substrate 102 from the lower surface side of the substrate 102 (S108).

The through hole 102a can be formed by, for example, patterning the mask layer 103 and etching the substrate 102 using the patterned mask layer 103 as a mask. The substrate 102 is etched by wet anisotropic etching using potassium hydroxide, tetramethylammonium hydroxide, or the like, for example.

By performing the processes described above, the specimen support 100 can be manufactured.

The method for manufacturing the specimen support 100 has the following features, for example.

In the method for manufacturing the specimen support 100, the specimen supporting film 104 is formed by film formation using LP-CVD. As a result, the internal stress of the specimen supporting film 104 can be realized as tension, enabling an increase in the size of the thin film region 104a.

Figure 11:
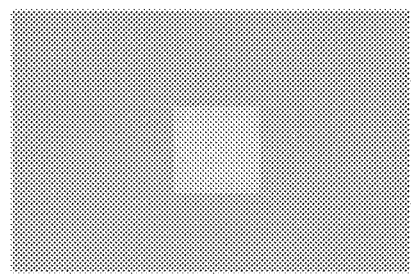
FIG. 11 is an optical microscope photograph of the specimen support in a case where LP-CVD is used to form a specimen supporting film.
Figure 12:
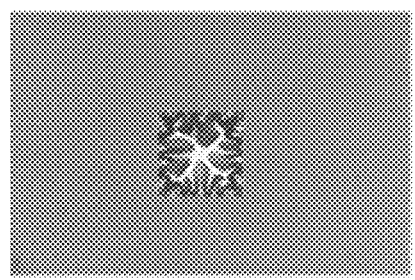
FIG. 12 is an optical microscope photograph of the specimen support in a case where sputtering is used to form the specimen supporting film.

FIG. 11 is an optical microscope photograph of the specimen support in a case where LP-CVD is used to form the specimen supporting film. FIG. 12 is an optical microscope photograph of the specimen support in a case where sputtering is used to form the specimen supporting film.

As illustrated in FIG. 12, when sputtering was used to form the specimen supporting film, the internal stress of the specimen supporting film was realized as compression, and as a result, wrinkles were observed on the specimen supporting film. When LP-CVD was used, however, as illustrated in FIG. 11, the internal stress of the specimen supporting film was realized as tension, and as a result, no wrinkles were observed on the specimen supporting film. Hence, by employing LP-CVD to form the specimen supporting film, a favorable specimen supporting film without wrinkles can be formed.

Figure 13:
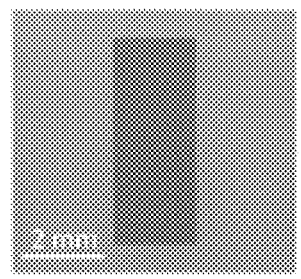
FIG. 13 is an optical microscope photograph of the specimen support manufactured using the method for manufacturing the specimen support according to one embodiment of the invention.

FIG. 13 is an optical microscope photograph of the specimen support manufactured using the method for manufacturing the specimen support described above. As illustrated in FIG. 13, by employing the specimen supporting film manufacturing method described above, it was possible to manufacture a specimen support having a thin film region with a large surface area. More specifically, it was possible to form the thin film region in a rectangular shape having a short side of 2 mm and a long side of 5 mm. Further, the thickness of the specimen supporting film was 30 nm. By reducing the thickness of the specimen supporting film in this manner, image degradation due to the effect of the specimen supporting film under a transmission electron microscope can be reduced.

1.2. Attaching Specimen Support to Retainer

Next, the specimen support with a specimen placed on the specimen supporting film 104 is attached to a retainer. The retainer used in the observation method according to this embodiment will be described below.

1.2.1. Retainer

Figure 14:
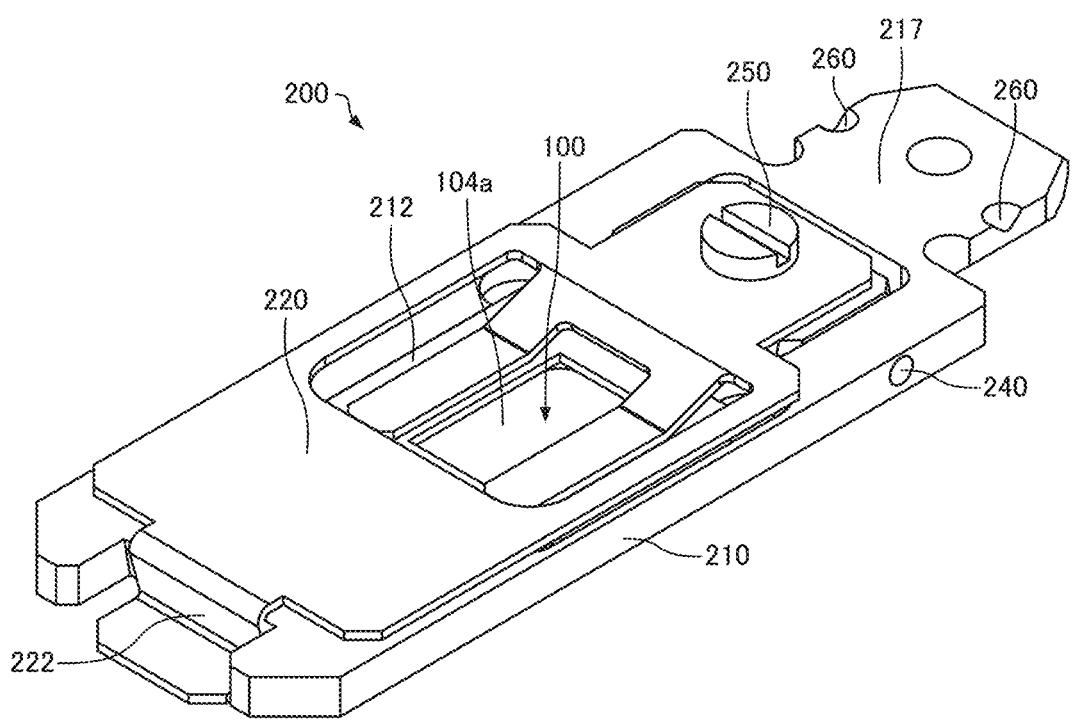
FIG. 14 is a schematic perspective view of a retainer.
Figure 15:
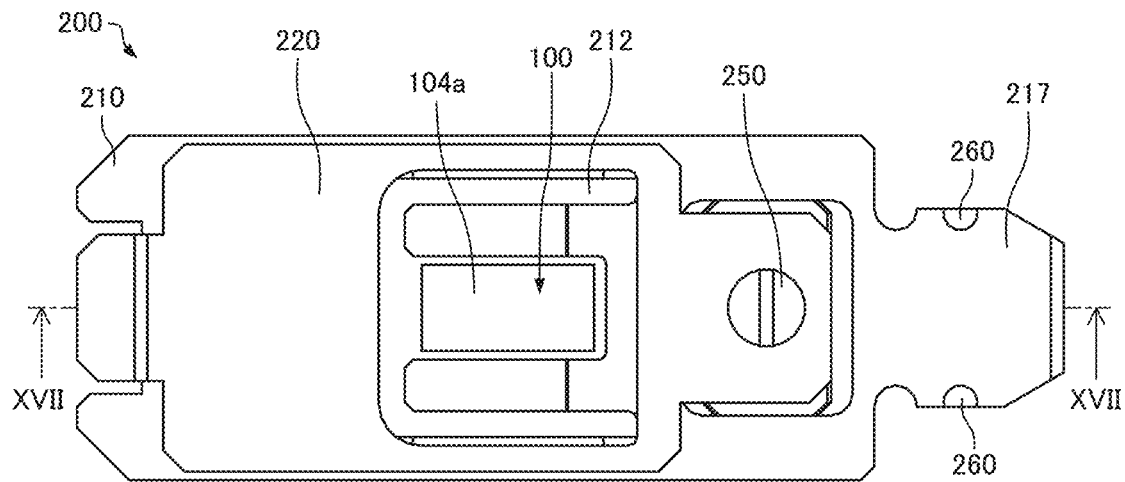
FIG. 15 is a schematic top view of the retainer.
Figure 16:
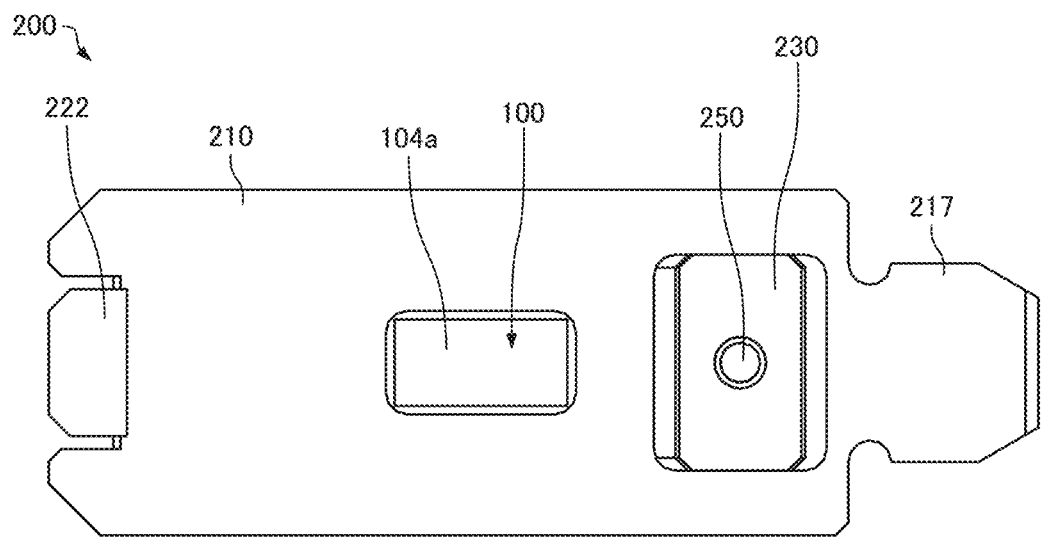
FIG. 16 is a schematic bottom view of the retainer.
Figure 17:
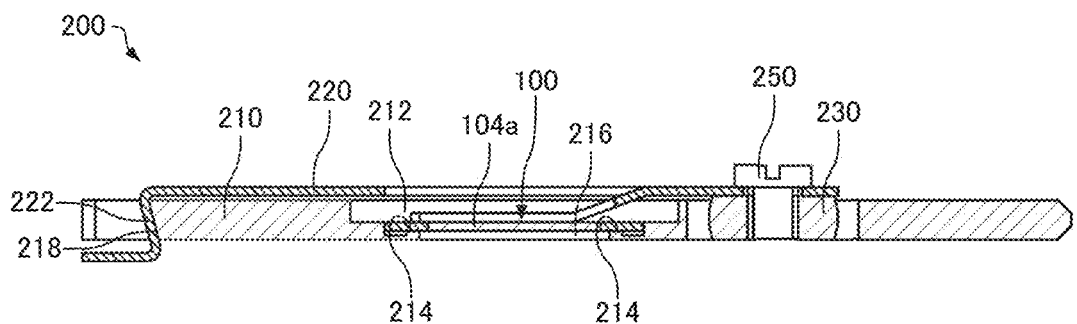
FIG. 17 is a schematic sectional view of the retainer.

FIG. 14 is a schematic perspective view of a retainer 200. FIG. 15 is a schematic top view of the retainer 200. FIG. 16 is a schematic bottom view of the retainer 200. FIG. 17 is a schematic sectional view of the retainer 200. Note that FIG. 17 is a sectional view taken along an XVII-XVII line in FIG. 15. Note that FIGS. 14-17 illustrate a state in which the specimen support 100 is attached to the retainer 200.

As illustrated in FIGS. 14-17, the retainer 200 includes a holder 210, a plate spring 220, a block 230, a pin 240, and a screw 250.

A groove 212 for holding the specimen support 100 is provided in the holder 210. The groove 212 has a shape corresponding to the shape of the specimen support 100. In the example illustrated in the figures, the planar shape of the specimen support 100 is rectangular, and therefore the planar shape of the groove 212 is also rectangular, i.e. the same shape as the planar shape of the specimen support 100. Thus, a gap between the specimen support 100 and the holder 210 can be reduced, and as a result, the specimen support 100 can be secured without rattling. As illustrated in FIG. 17, a placement surface 214 on which the specimen support 100 is placed and a through hole 216 are provided in the bottom of the groove 212.

The through hole 216 is a hole through which an electron beam passes in a transmission electron microscope. The through hole 216 is formed in a size that exposes the entirety of the thin film region 104a of the specimen support 100. As a result, the entire thin film region 104a can be observed under a transmission electron microscope. In the example illustrated in the figures, the through hole 216 is a square hole, but there are no specific limitations on the shape thereof.

The holder 210 is provided with a projecting portion 217 that is inserted into a transmission electron microscope retainer holding base, to be described below. Two recessed portions 260 are provided in the projecting portion 217. As will be described below, the two recessed portions 260 are used to secure the retainer 200 to the transmission electron microscope retainer holding base.

The plate spring 220 is secured to the block 230 by the screw 250. The specimen support 100 can be pressed against and secured to the placement surface 214 of the holder 210 by the plate spring 220. A diagonally shaped portion 218 formed from a diagonal cutout is provided on a tip end of the holder 210. A hook portion 222 that is hooked to the diagonally shaped portion 218 is provided on a tip end of the plate spring 220. By hooking the hook portion 222 to the diagonally shaped portion 218, a state in which the specimen support 100 is secured by the plate spring 220 can be maintained.

The pin 240 is inserted into a through hole in the block 230. The pin 240 is secured to the holder 210 by press-fitting or adhesion. Note that the pin 240 and the block 230 are not secured to each other. The plate spring 220 is capable of rotating together with the block 230 using the pin 240 as an axis.

1.2.2. Method for Attaching Specimen Support

Figure 18:
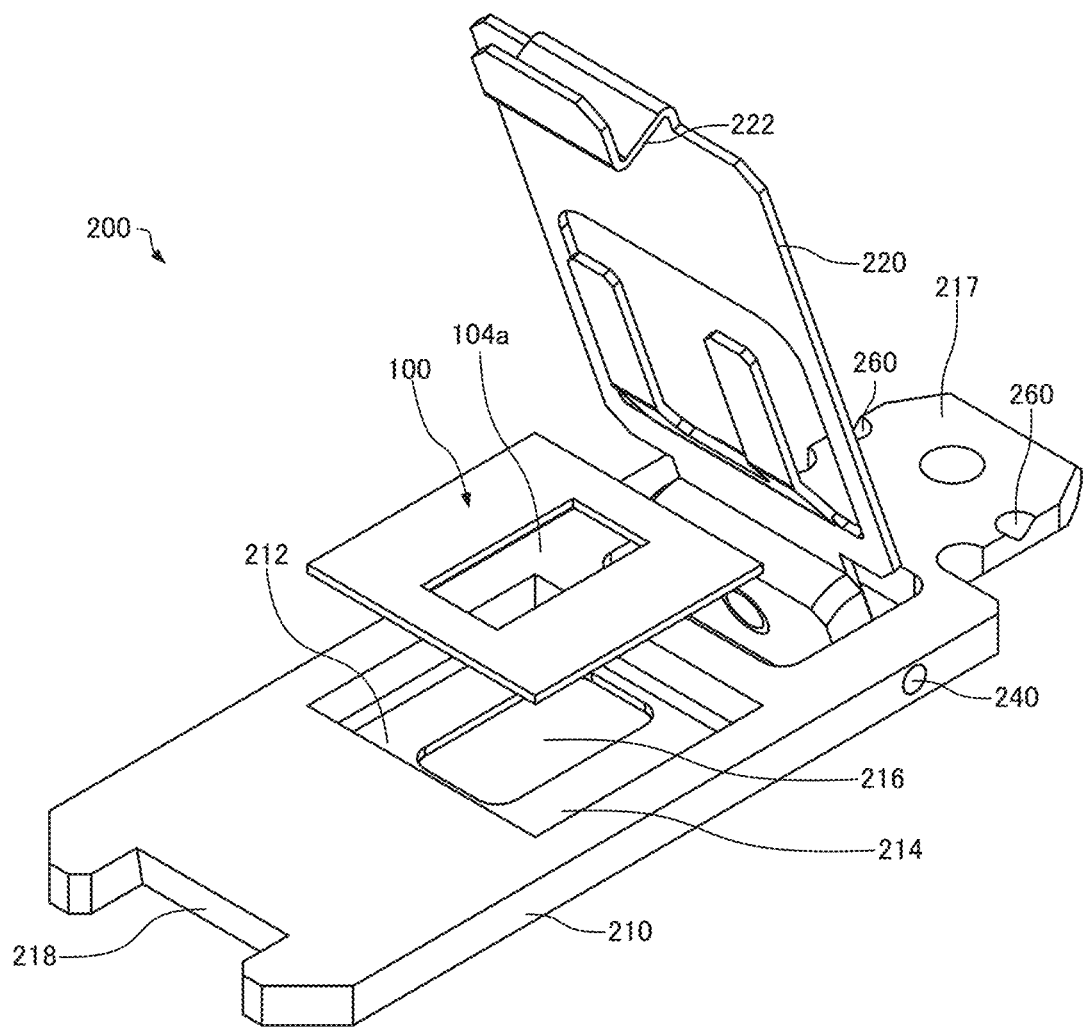
FIG. 18 is a schematic perspective view illustrating the manner in which the specimen support is attached to the retainer.

FIG. 18 is a schematic perspective view illustrating the manner in which the specimen support 100 is attached to the retainer 200.

As illustrated in FIG. 18, the plate spring 220 is gripped and raised by tweezers or the like. Next, the specimen support 100 is inserted into the groove 212 and placed on the placement surface 214. Next, as illustrated in FIG. 14, the hook portion 222 of the plate spring 220 is hooked to the diagonally shaped portion 218 of the holder 210. As a result, the specimen support 100 is pressed against and secured to the placement surface 214 by the plate spring 220. Thus, the specimen support 100 can be attached to the retainer 200.

1.3. Attaching Retainer to Optical Microscope Retainer Holding Base

Next, the retainer 200, to which the specimen support 100 with a specimen placed thereon is attached, is attached to an optical microscope retainer holding base. The optical microscope retainer holding base used in the observation method according to this embodiment will be described below.

1.3.1. Optical Microscope Retainer Holding Base

Figure 19:
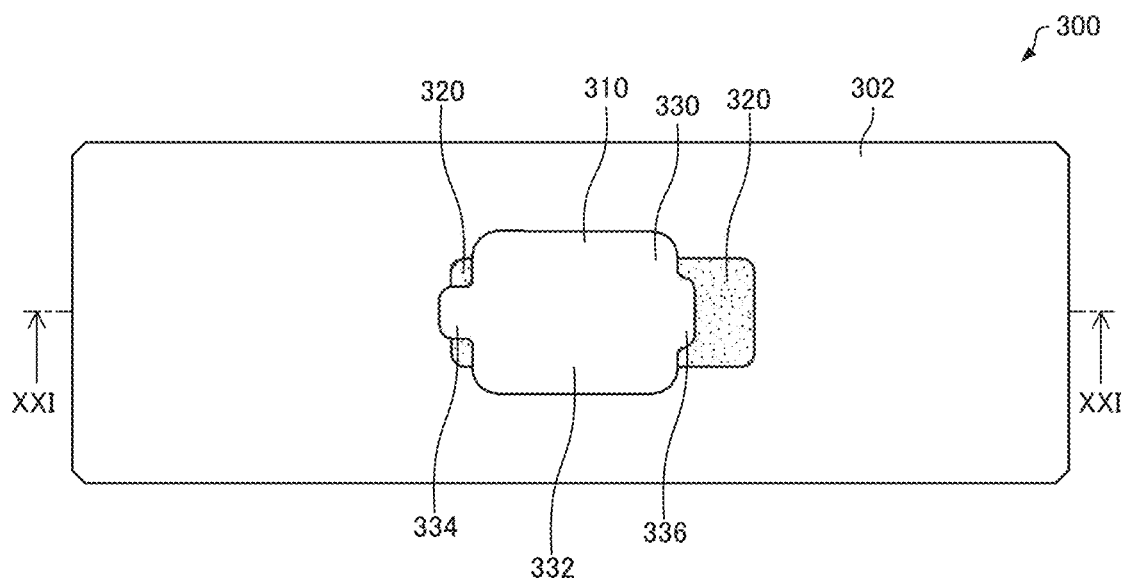
FIG. 19 is a schematic top view of an optical microscope retainer holding base.
Figure 20:
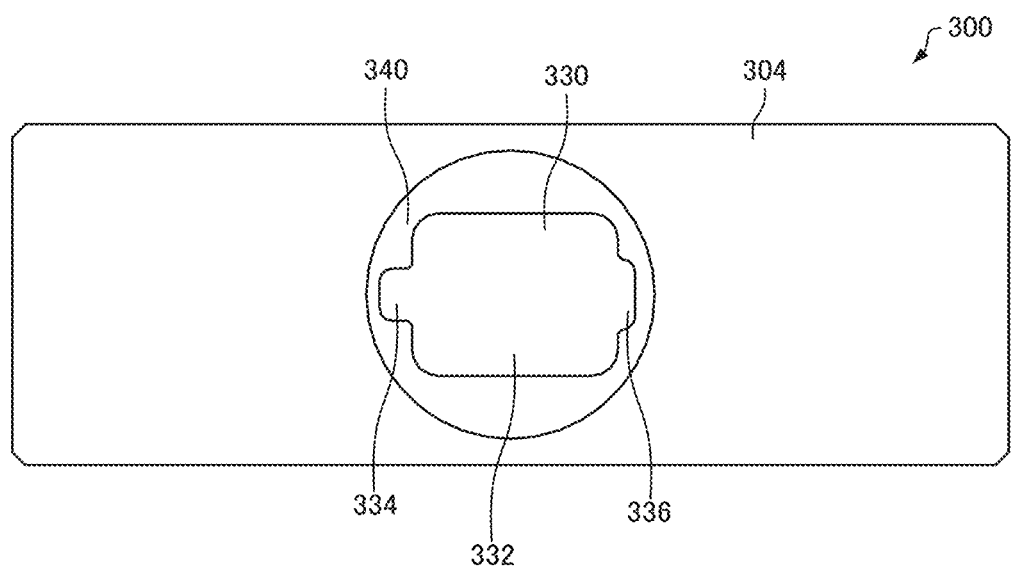
FIG. 20 is a schematic bottom view of the optical microscope retainer holding base.
Figure 21:
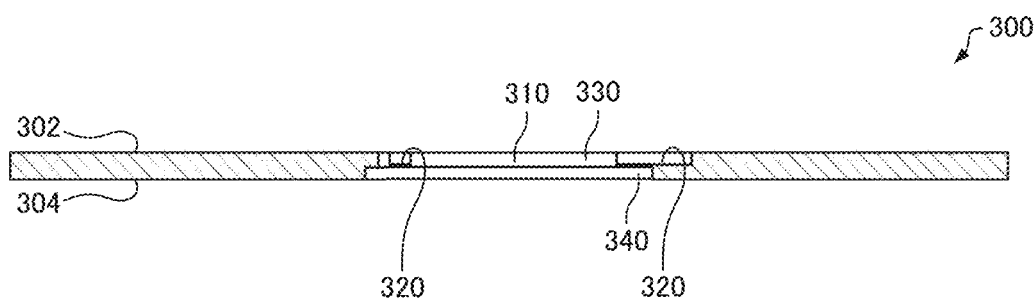
FIG. 21 is a schematic sectional view of the optical microscope retainer holding base.

FIG. 19 is a schematic top view of an optical microscope retainer holding base 300 (referred to simply as the "holding base 300" hereafter). FIG. 20 is a schematic bottom view of the holding base 300. FIG. 21 is a schematic sectional view of the holding base 300. Note that FIG. 21 is a sectional view taken along an XXI-XXI line in FIG. 19.

As illustrated in FIGS. 19-21, the holding base 300 is a plate-shaped member. The holding base 300 is configured to be attachable to a specimen stage of an optical microscope. Note that the holding base 300 may be attached to the specimen stage of the optical microscope either directly or via a holder, not shown in the figures.

The holding base 300 has a similar outer shape to a slide for an optical microscope. The holding base 300 can therefore be attached to the specimen stage of an optical microscope easily, in a similar manner to a slide. Note that the shape of the holding base 300 is not limited thereto, and the holding base 300 may take any shape that can be attached to the specimen stage of an optical microscope.

The holding base 300 has an upper surface 302 and a lower surface 304.

As illustrated in FIG. 19, the upper surface 302 of the holding base 300 is provided with a groove 310 for disposing the retainer 200. Using the groove 310, the retainer 200 can be secured without rattling. A placement surface 320 on which the retainer 200 is placed and a through hole 330 are provided in the bottom of the groove 310.

The through hole 330 includes a first part 332 for preventing interference with an object lens of the optical microscope, a second part 334 for preventing interference with the hook portion 222 of the retainer 200, and a third part 336 for preventing interference with the block 230 of the retainer 200. By providing the first part 332, the second part 334, and the third part 336 in the through hole 330 in this manner, the retainer 200 can be disposed so that the plate spring 220 side (the front surface side) thereof is positioned on the placement surface 320 side or the holder 210 side (the rear surface side) thereof is positioned on the placement surface 320 side.

As illustrated in FIG. 20, a recessed portion 340 for preventing interference with the object lens of the optical microscope is provided in the lower surface 304 of the holding base 300. The recessed portion 340 and the groove 310 communicate through the through hole 330.

The holding base 300 includes the placement surface 320 on which both the front surface side and the rear surface side of the retainer 200 can be placed. Here, an upright microscope for observing a specimen from above and an inverted microscope for observing a specimen from below are available as optical microscopes. When a specimen is observed under an optical microscope, the object lens must be brought close to the specimen. With the holding base 300, both the front surface side and the rear surface side of the retainer 200 can be placed on the placement surface 320, and therefore the object lens can be brought close to the specimen in both an upright microscope and an inverted microscope.

Figure 22:
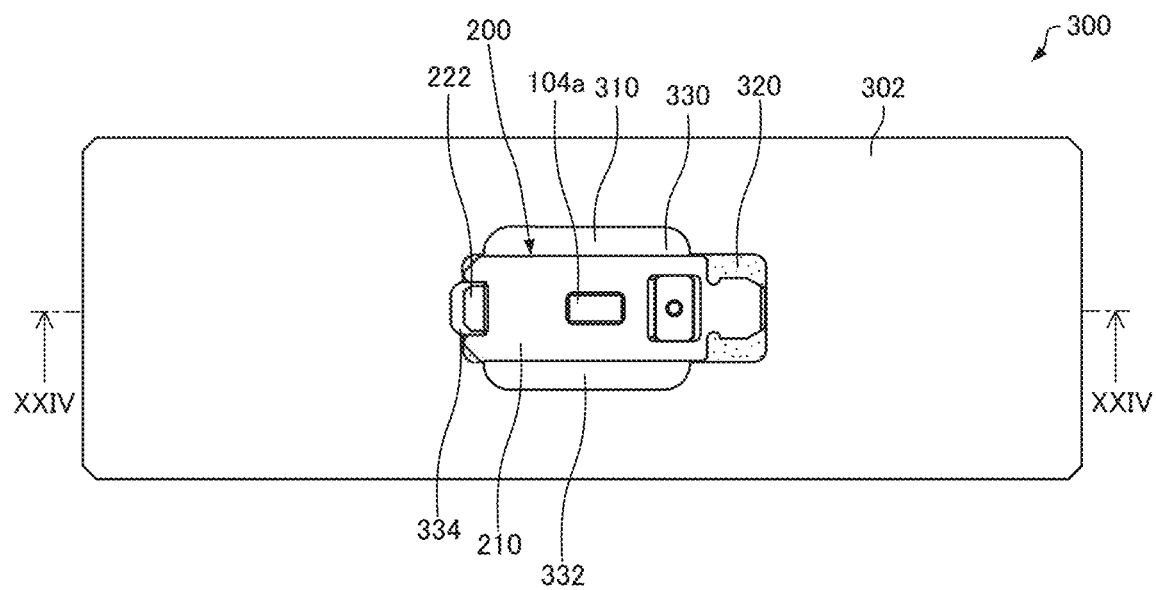
FIG. 22 is a schematic top view of a state in which the retainer is attached to the optical microscope retainer holding base.
Figure 23:
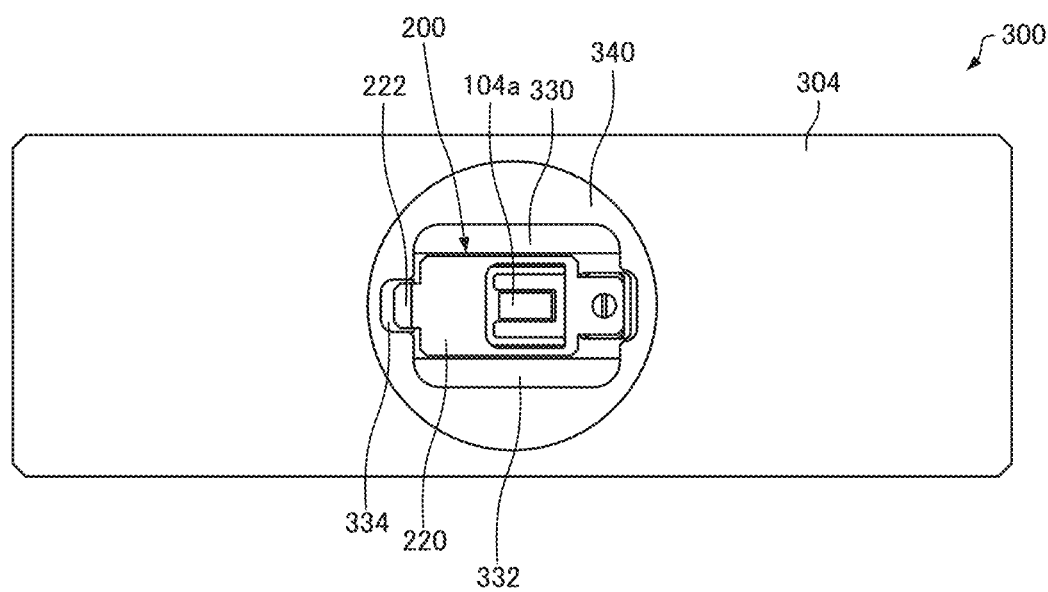
FIG. 23 is a schematic bottom view of a state in which the retainer is attached to the optical microscope retainer holding base.
Figure 24:
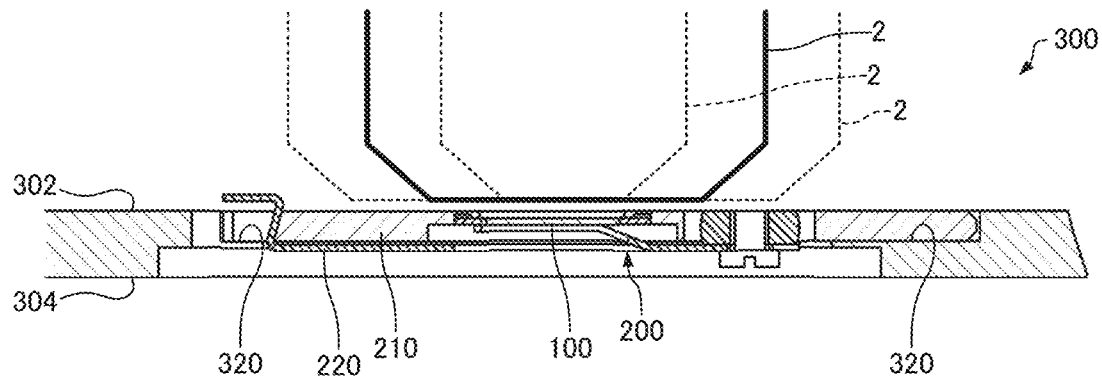
FIG. 24 is a schematic sectional view of a state in which the retainer is attached to the optical microscope retainer holding base.

1.3.2. Method for Attaching Retainer to Optical Microscope Retainer Holding Base FIG. 22 is a schematic top view of a state in which the retainer 200 is attached to the holding base 300. FIG. 23 is a schematic bottom view of a state in which the retainer 200 is attached to the holding base 300. FIG. 24 is a schematic sectional view of a state in which the retainer 200 is attached to the holding base 300. Note that FIG. 24 is a sectional view taken along an XXIV-XXIV line in FIG. 22.

FIGS. 22-24 illustrate a case in which a specimen is observed under an upright microscope 2. Note that in FIG. 24, dotted lines show the movement range of the object lens of the upright microscope 2.

As illustrated in FIGS. 22-24, when a specimen is observed under the upright microscope 2, the retainer 200 is placed on the holding base 300 so that the plate spring 220 side of the retainer 200 is positioned on the placement surface 320 side. At this time, as illustrated in FIG. 24, the hook portion 222 of the retainer 200 is disposed in a position not interfering with the object lens of the upright microscope 2. By placing the retainer 200 on the holding base 300 so that the plate spring 220 side of the retainer 200 is disposed on the placement surface 320 side, the specimen support 100 held by the retainer 200 is disposed on the object lens side of the upright microscope 2. As a result, the distance between the object lens of the upright microscope 2 and the specimen support 100 can be reduced.

Figure 25:
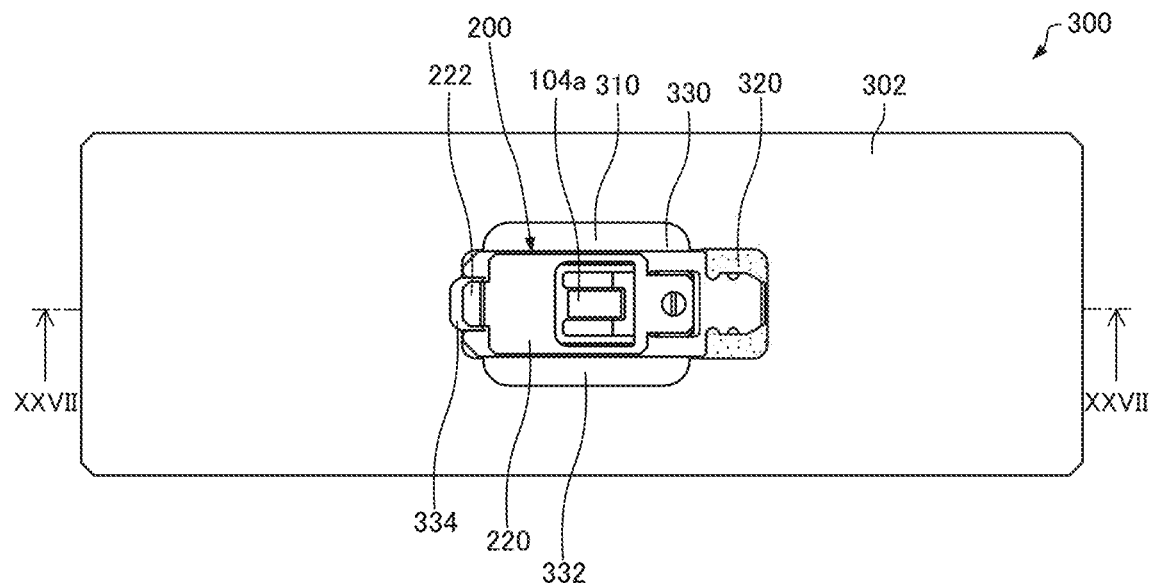
FIG. 25 is a schematic top view of a state in which the retainer is attached to the optical microscope retainer holding base.
Figure 26:
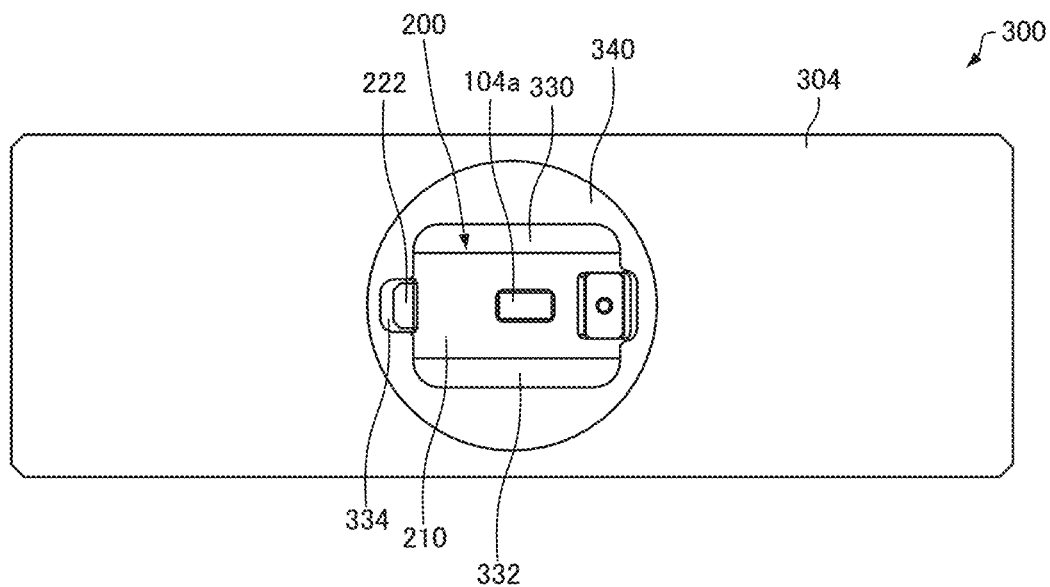
FIG. 26 is a schematic bottom view of a state in which the retainer is attached to the optical microscope retainer holding base.
Figure 27:
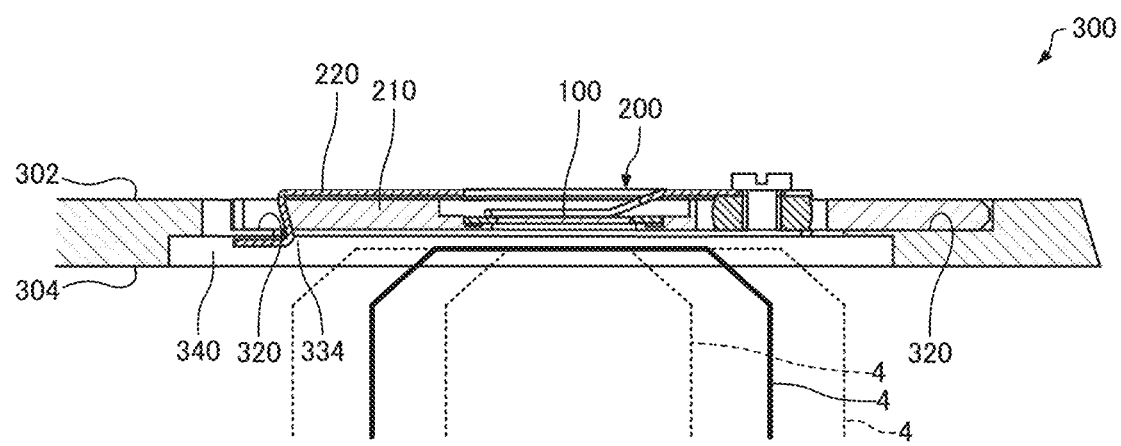
FIG. 27 is a schematic sectional view of a state in which the retainer is attached to the optical microscope retainer holding base.

FIG. 25 is a schematic top view of a state in which the retainer 200 is attached to the holding base 300. FIG. 26 is a schematic bottom view of a state in which the retainer 200 is attached to the holding base 300. FIG. 27 is a schematic sectional view of a state in which the retainer 200 is attached to the holding base 300. Note that FIG. 27 is a sectional view taken along an XXVII-XXVII line in FIG. 25.

FIGS. 25-27 illustrate a case in which a specimen is observed under an inverted microscope 4. Note that in FIG. 27, dotted lines show the movement range of the object lens of the inverted microscope 4.

As illustrated in FIGS. 25-27, when a specimen is observed under the inverted microscope 4, the retainer 200 is placed on the holding base 300 so that the holder 210 side of the retainer 200 is positioned on the placement surface 320 side. At this time, the hook portion 222 of the retainer 200 is disposed in the second part 334 of the through hole 330 so as not to interfere with the object lens of the inverted microscope 4. By placing the retainer 200 on the holding base 300 so that the holder 210 side of the retainer 200 is positioned on the placement surface 320 side, the specimen support 100 held by the retainer 200 is disposed on the object lens side of the inverted microscope 4. As a result, the distance between the object lens of the inverted microscope 4 and the specimen support 100 can be reduced.

Furthermore, the recessed portion 340 is provided in the lower surface 304 of the holding base 300. Therefore, the object lens of the inverted microscope 4 can be brought closer to the specimen support 100. By providing the recessed portion 340 in the holding base 300 in this manner, the distance between the object lens of the inverted microscope 4 and the specimen support 100 can be reduced so as to be approximately equal to the distance between the object lens of the upright microscope 2 and the specimen support 100.

1.4. Observing Specimen Under Optical Microscope

Next, the holding base 300 is attached to the specimen stage of an optical microscope and observed under the optical microscope. As illustrated in FIG. 24, when the optical microscope used for observation is the upright microscope 2, the specimen is observed in a state where the retainer 200 is placed on the holding base 300 such that the plate spring 220 side thereof is positioned on the placement surface 320 side. Further, as illustrated in FIG. 27, when the optical microscope used for observation is the inverted microscope 4, the specimen is observed in a state where the retainer 200 is placed on the holding base 300 such that the holder 210 side thereof is positioned on the placement surface 320 side.

When the specimen is observed under the optical microscope, information indicating coordinate positions of the fiducial markers 106 is also obtained.

1.5. Attaching Retainer to Transmission Electron Microscope Retainer Holding Base Next, the retainer 200, to which the specimen support 100 with a specimen placed thereon is attached, is attached to a transmission electron microscope retainer holding base. The transmission electron microscope retainer holding base used in the observation method according to this embodiment will be described below.

1.5.1. Transmission Electron Microscope Retainer Holding Base

Figure 28:
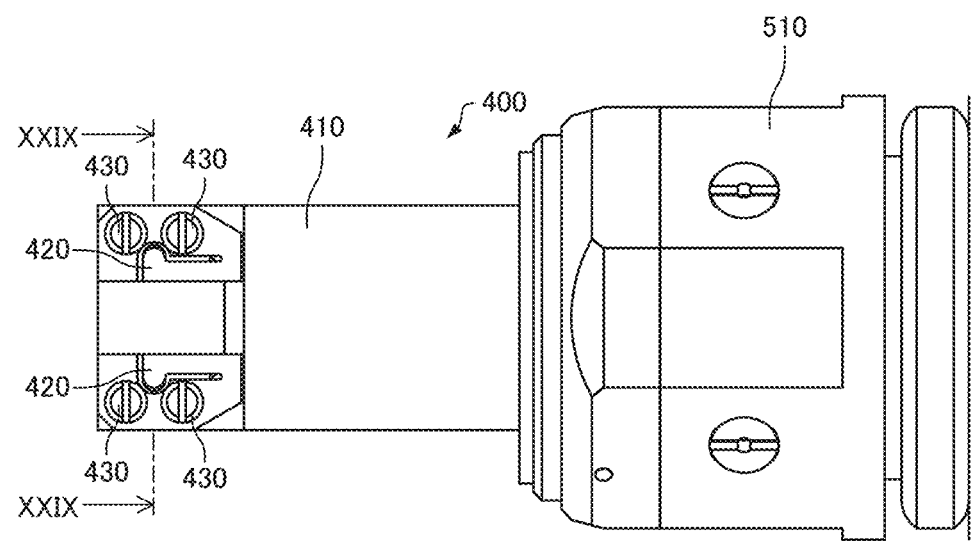
FIG. 28 is a schematic plan view of a transmission electron microscope retainer holding base.
Figure 29:
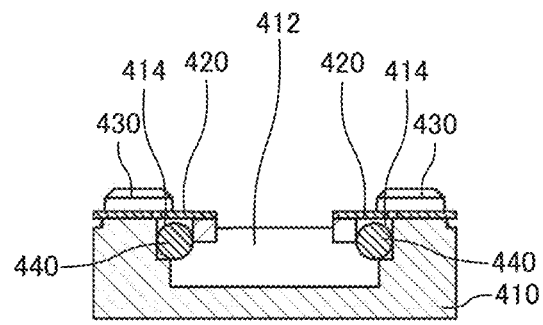
FIG. 29 is a schematic sectional view of the transmission electron microscope retainer holding base.

FIG. 28 is a schematic plan view of a transmission electron microscope retainer holding base 400 (referred to simply as the "holding base 400" hereafter). FIG. 29 is a schematic sectional view of the holding base 400. Note that for convenience, FIG. 28 illustrates only a tip end portion of a transmission electron microscope specimen holder 510. Further, FIG. 29 is a sectional view taken along an XXIX-XXIX line in FIG. 28.

As illustrated in FIG. 28, the holding base 400 is provided on the tip end portion of the transmission electron microscope specimen holder 510. As illustrated in FIGS. 28 and 29, the holding base 400 includes a holder 410, a plate spring 420, a screw 430, and two balls 440.

The holder 410 is secured to the tip end of the specimen holder 510. As illustrated in FIG. 29, a groove 412 for inserting the projecting portion 217 (see FIG. 14 and so on) of the retainer 200 is provided in the holder 410. Holes 414 for holding the balls 440 are also provided in the holder 410. Two holes 414 are provided, and the two holes 414 are provided on respective sides of the groove 412. The plate spring 420 applies force for pressing the balls 440 against the retainer 200 when the projecting portion 217 of the retainer 200 is inserted into the groove 412. By fitting the balls 440 into the recessed portion 260 of the retainer 200 and pressing the balls 440 against a surface that defines the recessed portion 260 using the plate spring 420, the retainer 200 is secured to the holding base 400.

The screw 430 is used to secure the plate spring 420 to the holder 410. The plate spring 420 is secured to the holder 410 by tightening the screw 430.

Figure 30:
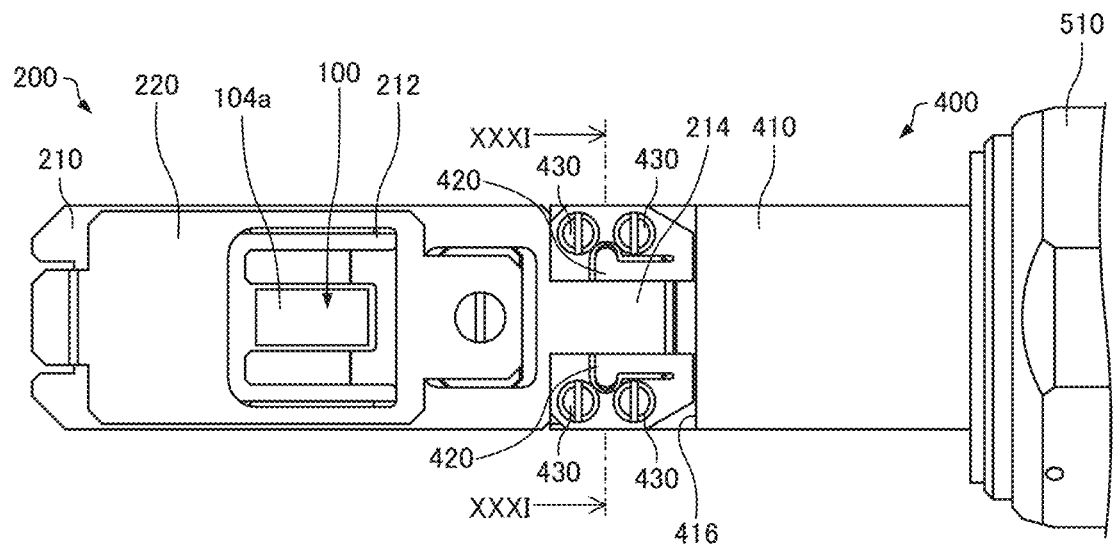
FIG. 30 is a schematic plan view of a state in which the retainer is attached to the transmission electron microscope retainer holding base.
Figure 31:
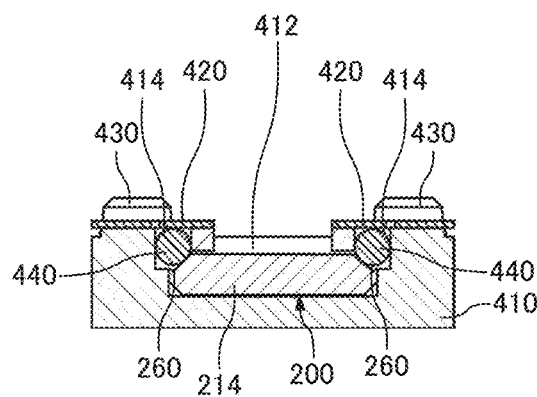
FIG. 31 is a schematic sectional view of a state in which the retainer is attached to the transmission electron microscope retainer holding base.

1.5.2. Method for Attaching Retainer to Transmission Electron Microscope Retainer Holding Base FIG. 30 is a schematic plan view of a state in which the retainer 200 is attached to the holding base 400. FIG. 31 is a schematic sectional view of a state in which the retainer 200 is attached to the holding base 400. Note that FIG. 31 is a sectional view taken along an XXXI-XXXI line in FIG. 30.

First, the projecting portion 217 of the retainer 200 is inserted into the groove 412 in the holding base 400. At this time, the balls 440 are lifted onto the projecting portion 217 so as to roll as the projecting portion 217 is inserted. When the projecting portion 217 of the retainer 200 is inserted so as to abut an abutment surface 416 of the holding base 400, as illustrated in FIG. 31, the balls 440 are fitted into the recessed portion 260 of the retainer 200 and pressed against the surface defining the recessed portion 260 by the plate spring 420. As a result, the retainer 200 is secured to the holding base 400. By implementing the process described above, the retainer 200 can be attached to the holding base 400.

1.6. Observing Specimen Under Transmission Electron Microscope

Next, the holding base 400 with the retainer 200 attached thereto is loaded into a transmission electron microscope, and the specimen is observed under the transmission electron microscope. When the specimen is observed under the transmission electron microscope, information indicating the coordinate positions of the fiducial markers 106 is also obtained. The transmission electron microscope used in the observation method according to this embodiment will be described in detail below.

By implementing the processes described above, the same specimen can be observed under both an optical microscope and a transmission electron microscope.

Note that in the embodiment described above, a case in which the specimen is observed under an optical microscope and then observed under a transmission electron microscope was described, but the specimen may be observed under a transmission electron microscope and then observed under an optical microscope. Moreover, the specimen may be observed under an optical microscope and a transmission electron microscope repeatedly.

1.7. Features

The observation method according to this embodiment has the following features, for example.

The observation method according to this embodiment includes placing the specimen on the specimen supporting film 104 of the specimen support 100, attaching the specimen support 100 to the retainer 200, attaching the retainer 200 to the optical microscope retainer holding base 300, attaching the optical microscope retainer holding base 300 to the specimen stage of an optical microscope and observing the specimen under the optical microscope, attaching the retainer 200 to the transmission electron microscope retainer holding base 400, and loading the transmission electron microscope retainer holding base 400 into a transmission electron microscope 500 and observing the specimen under the transmission electron microscope.

Hence, in the observation method according to this embodiment, a specimen holding tool set including the retainer 200, the holding base 300, and the holding base 400 is used, and therefore, when the specimen support 100 is attached to the retainer 200, the specimen can be observed under an optical microscope and a transmission electron microscope without directly contacting the specimen and the specimen support 100. As a result, the same specimen can be observed easily under an optical microscope and a transmission electron microscope.

The specimen holding tool set used in the observation method according to this embodiment is used when the same specimen is observed under an optical microscope and a transmission electron microscope, and includes the retainer 200 for holding the specimen support 100 supporting the specimen, the optical microscope retainer holding base 300 that holds the retainer 200 and can be attached to the specimen stage of an optical microscope, and the transmission electron microscope retainer holding base 400 that holds the retainer 200 and can be loaded into a transmission electron microscope.

Hence, with this specimen holding tool set, when the specimen support 100 is attached to the retainer 200, the specimen can be observed under an optical microscope and a transmission electron microscope without directly contacting the specimen and the specimen support 100.

In the specimen holding tool set, the recessed portion 340 is provided in the optical microscope retainer holding base 300 to prevent interference with the object lens of an optical microscope. As a result, the object lens of the optical microscope can be brought closer to the specimen.

In the specimen holding tool set, the optical microscope retainer holding base 300 includes the placement surface 320 on which the retainer 200 is placed, and the placement surface 320 is configured such that both the front surface side and the rear surface side of the retainer 200 can be placed thereon. Accordingly, the specimen can be brought close to the object lens in both an upright microscope and an inverted microscope. As a result, the specimen can be observed under both an upright microscope and an inverted microscope.

Figure 32:
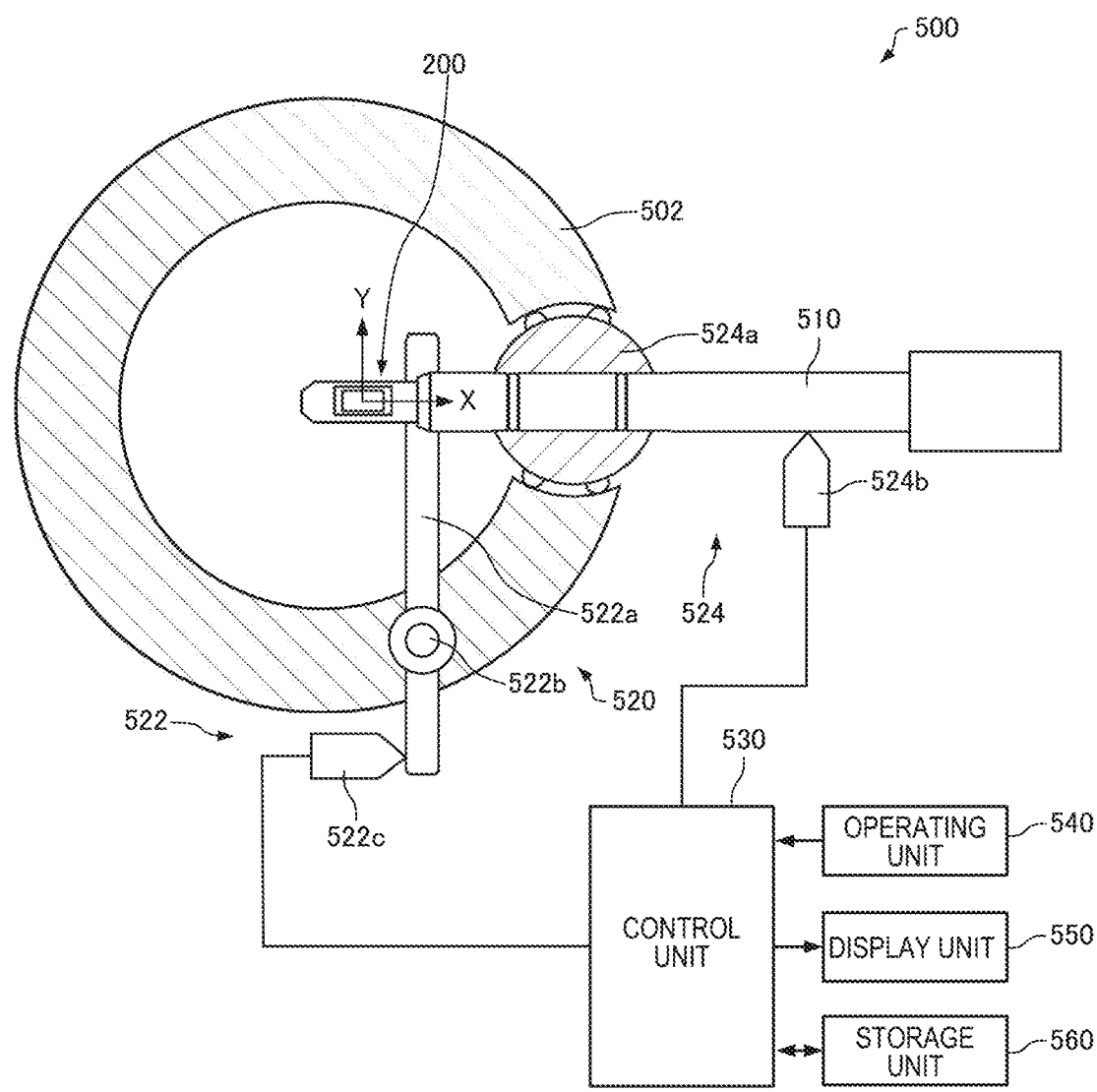
FIG. 32 is a diagram illustrating the configuration of a transmission electron microscope according to one embodiment of the invention.

2. Transmission Electron Microscope 2.1. Configuration of Transmission Electron Microscope Next, a transmission electron microscope according to one embodiment of the invention will be described with reference to the figures. FIG. 32 is a diagram illustrating a configuration of the transmission electron microscope 500. FIG. 32 illustrates a state in which a specimen has been loaded into a specimen chamber in a column 502 of the transmission electron microscope. Note that FIG. 32 illustrates an X axis (a first axis) and a Y axis (a second axis) as two mutually orthogonal axes.

In the transmission electron microscope 500, an image (a TEM image) can be obtained by irradiating the specimen with an electron beam and forming an image from the electrons passing through the specimen. Although not shown in the figures, the transmission electron microscope 500 includes an electron gun for emitting the electron beam, an illumination-lens system for illuminating the specimen by focusing the electron beam, an imaging lens system for forming an image from the electrons passing through the specimen, and an imaging apparatus for photographing the image formed by the imaging lens system. The illumination-lens system and the imaging lens system are disposed in the column 502. The transmission electron microscope 500 may also include a scanning coil for scanning the specimen with the electron beam and a detector for detecting the electrons passing through the specimen. In other words, the transmission electron microscope 500 is also capable of functioning as a scanning transmission electron microscope and obtaining a scanning transmission electron microscope image (a STEM image). The transmission electron microscope 500 may also include an analysis apparatus such as an energy-dispersive X-ray spectrometer or a wavelength-dispersive X-ray spectrometer.

As illustrated in FIG. 32, the transmission electron microscope 500 includes a specimen holder 510 having a first moving mechanism, a second moving mechanism 520, a control unit 530, an operating unit 540, a display unit 550, and a storage unit 560.

The retainer 200 is held on the tip end of the specimen holder 510 via the holding base 400 (not shown). The specimen holder 510 includes the first moving mechanism, which moves the specimen by moving the holding base 400. The specimen holder 510 will be described in detail below.

The second moving mechanism 520 includes an X moving mechanism 522 and a Y moving mechanism 524. The X moving mechanism 522 and the Y moving mechanism 524 move the specimen by moving the specimen holder 510. In the transmission electron microscope 500, the specimen can be moved two-dimensionally by the X moving mechanism 522 and the Y moving mechanism 524.

The X moving mechanism 522 moves the specimen along the X axis. In other words, the X moving mechanism 522 moves the specimen in an X direction. The X moving mechanism 522 includes a lever 522*a*, a shaft member 522*b* including a bearing, and a drive unit 522*c*. In the X moving mechanism 522, the specimen holder 510 is moved in the X direction by rotating the lever 522*a*, which contacts the specimen holder 510, using the shaft member 522*b* as a rotational center. The drive unit 522*c* includes a motor and a feed screw, and the lever 522*a* is rotated by rotating the motor so that the feed screw performs a linear motion.

The Y moving mechanism 524 moves the specimen along the Y axis. In other words, the Y moving mechanism 524 moves the specimen in a Y direction. The Y moving mechanism 524 includes a spherical bearing 524*a* and a drive unit 524*b*. In the Y moving mechanism 524, the specimen is moved in the Y direction by rotating the specimen holder 510 using the spherical bearing 524*a*, into which the specimen holder 510 is inserted, as a fulcrum. The drive unit 524*b* includes a motor and a feed screw, and the specimen holder 510 is rotated by rotating the motor so that the feed screw performs a linear motion. The motor of the X moving mechanism 522 and the motor of the Y moving mechanism 524 are connected to the control unit 530 so as to be controlled by the control unit 530.

The operating unit 540 executes processing for converting an instruction from a user into a signal and transmitting the signal to the control unit 530. The operating unit 540 can be realized using an input device such as a trackball, buttons, keys, a touch panel display, or a microphone, for example. The user can input an instruction to modify the position coordinates of the specimen through the operating unit 540.

The display unit 550 outputs an image generated by the control unit 530. The display unit 550 can be realized using a display such as an LCD (liquid crystal display), for example.

The storage unit 560 stores programs and data used by the control unit 530 to execute various types of calculation processing and control processing. The storage unit 560 is also used as a working area of the control unit 530. The storage unit 560 can be realized using a RAM (Random Access Memory), a ROM (Read Only Memory), a hard disk, or the like, for example.

The control unit 530 executes processing for controlling the X moving mechanism 522 and the Y moving mechanism 524. The control unit 530 also executes processing for controlling the first moving mechanism 512 (see FIG. 33, to be described below) of the specimen holder 510, to be described below. The control unit 530 also executes control for displaying the coordinate information of the specimen on the display unit 550. The functions of the control unit 530 can be realized by executing a program using various types of processors (a CPU (Central Processing Unit) or the like). Note that at least some of the functions of the control unit 530 may be realized using a dedicated circuit such as an ASIC (a gate array or the like).

Figure 33:
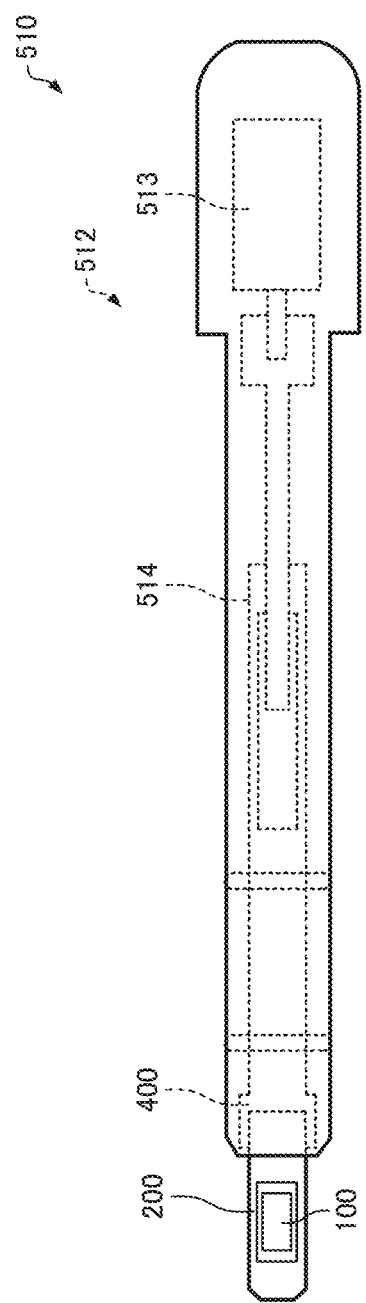
FIG. 33 is a schematic view of a specimen holder.

FIG. 33 is a schematic view of the specimen holder 510. The specimen holder 510 includes the first moving mechanism 512.

The first moving mechanism 512 moves the specimen in the X direction by moving the holding base 400 in the X direction. By providing the specimen holder 510 with the first moving mechanism 512, the observable region of the specimen can be enlarged.

As illustrated in FIG. 33, the first moving mechanism 512 includes a motor 513 and a spline 514. The first moving mechanism 512 converts the rotation of the motor 513, which is built into the specimen holder 510, into a linear motion using the spline 514. The holding base 400, which is attached to a tip end of the spline 514, is moved by the linear motion of the spline 514. The retainer 200 is moved by the movement of the holding base 400. The motor 513 is connected to the control unit 530 so as to be controlled by the control unit 530.

By providing the transmission electron microscope 500 with the first moving mechanism 512 and the second moving mechanism 520, the observable region of the specimen can be enlarged.

Figure 34:
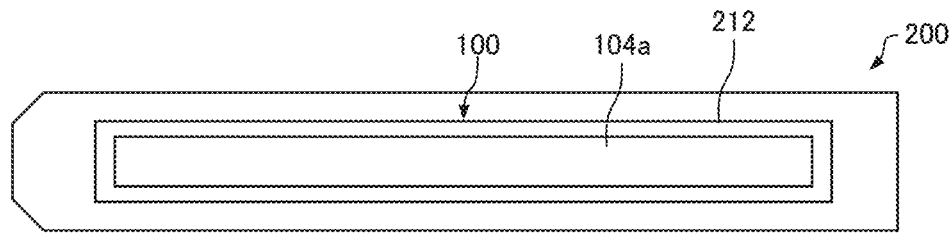
FIG. 34 is a schematic plan view illustrating a modified example of the retainer.
Figure 35:
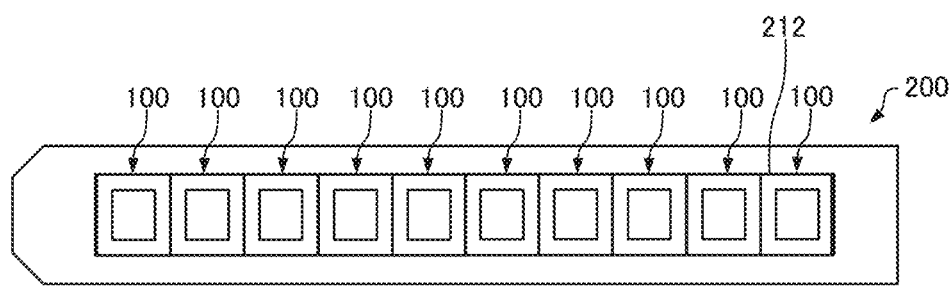
FIG. 35 is a schematic plan view illustrating a modified example of the retainer.

FIGS. 34 and 35 are schematic plan views illustrating modified examples of the retainer 200.

As described above, in the transmission electron microscope 500, the specimen holder 510 includes the first moving mechanism 512, and therefore the observable region can be enlarged in the X direction. As a result, as illustrated in FIGS. 34 and 35, a retainer 200 that is long in the X direction can be used. In the example illustrated in FIG. 34, a specimen support 100 having a thin film region 104*a* that extends for several cm in the X direction is attached to the retainer 200. Further, in the example illustrated in FIG. 35, a plurality of specimen supports 100 are arranged in the X direction and attached to the retainer 200. As a result, a plurality of specimens can be loaded into the transmission electron microscope 500 simultaneously.

2.2. Specifying Position Coordinates of Specimen Under Transmission Electron Microscope In the transmission electron microscope 500, the control unit 530 specifies the position coordinates of the specimen under the transmission electron microscope based on the amount by which the first moving mechanism 512 moves the specimen and the amount by which the second moving mechanism 520 moves the specimen. The control unit 530 specifies the position coordinates of the specimen using at least one of a first method and a second method to be described below, for example. The methods used by the control unit 530 to specify the position coordinates of the specimen will be described below.

2.2.1. First Method

Figure 36:
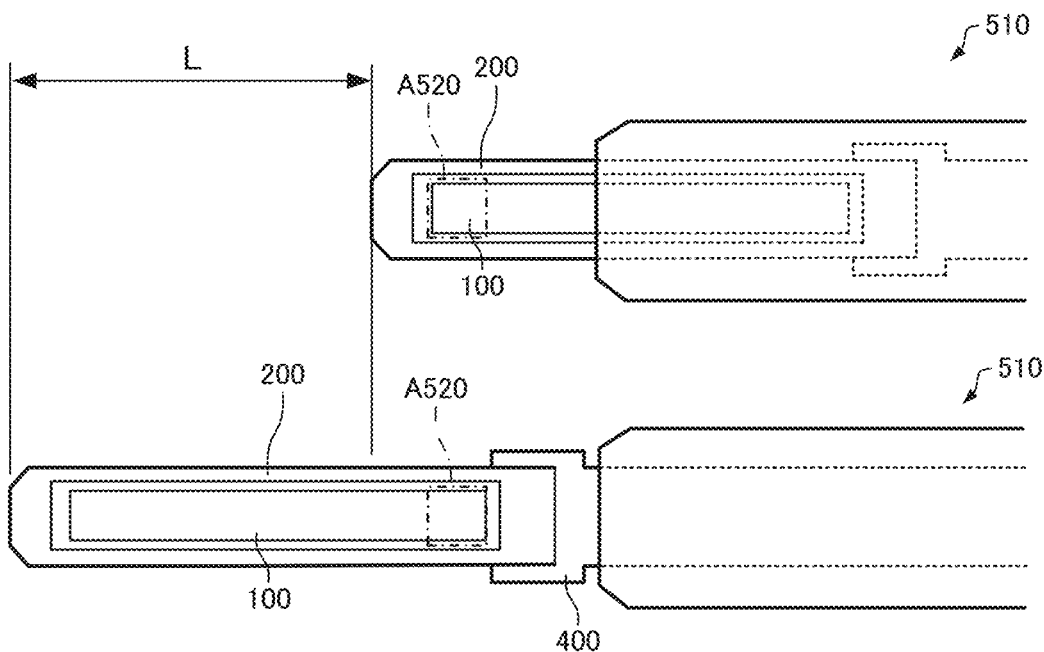
FIG. 36 is a diagram illustrating operations of two moving mechanisms of the transmission electron microscope.

FIG. 36 is a diagram illustrating operations of the first moving mechanism 512 and the second moving mechanism 520. Note that for convenience, a case in which the retainer 200 illustrated in FIG. 34 is used will be described below.

As illustrated in FIG. 36, in the transmission electron microscope 500, the observable region can be enlarged in the X direction by an operation of the first moving mechanism 512. Note that the observable region in the Y direction is not changed by an operation of the first moving mechanism 512. In the example illustrated in FIG. 36, a region A520 can be observed in response to an operation of the second moving mechanism 520, but since the specimen can be moved by a distance L in the X direction by an operation of the first moving mechanism 512, the observable region is similarly enlarged by the distance L in the X direction.

Figure 37:
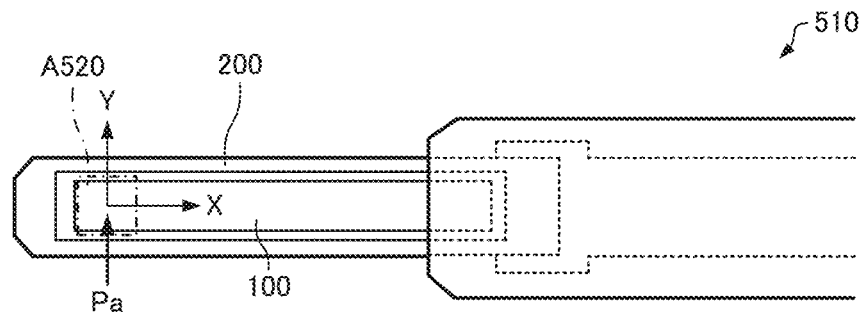
FIG. 37 is a diagram illustrating a coordinate system of the transmission electron microscope.
Figure 38:
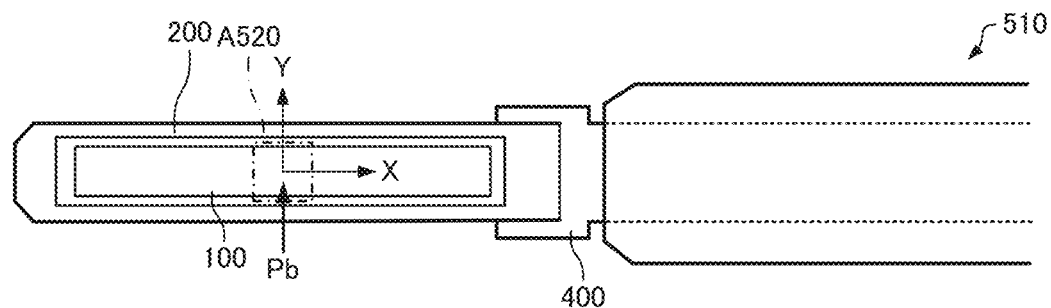
FIG. 38 is a diagram illustrating the coordinate system of the transmission electron microscope.
Figure 39:
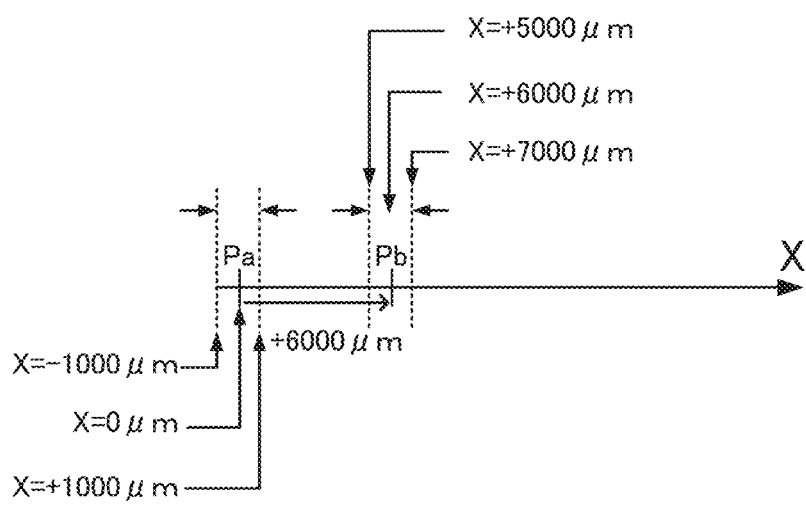
FIG. 39 is a diagram illustrating the coordinate system of the transmission electron microscope.

FIGS. 37, 38, and 39 are diagrams illustrating a coordinate system of the transmission electron microscope 500. Hereafter, a coordinate system of the first moving mechanism 512 will be expressed as X1, a coordinate system of the second moving mechanism 520 will be expressed as (X2, Y2), and the coordinate system of the transmission electron microscope 500 will be expressed as (X, Y).

In the transmission electron microscope 500, the two moving mechanisms each have a coordinate system. More specifically, the first moving mechanism 512 has the coordinate system X1 and the second moving mechanism 520 has the coordinate system (X2, Y2). To associate the coordinate system of the transmission electron microscope 500 with a coordinate system of an optical microscope, the position coordinates of the specimen under the transmission electron microscope 500 are preferably expressed by a single coordinate system. In the transmission electron microscope 500, the position coordinates of the specimen are expressed using a coordinate system (X, Y)=(X1+X2, Y2) expressed in a form obtained by adding together the position coordinate of the specimen in the coordinate system X1 of the first moving mechanism 512 and the position coordinates of the specimen in the coordinate system (X2, Y2) of the second moving mechanism 520. This will be described below using the example illustrated in FIGS. 37 and 38.

A position Pa of the specimen, illustrated in FIG. 37, is set at coordinate X1=0, coordinates (X2, Y2)=(0, 0). In other words, position Pa is set as the origin of the coordinate system (X, Y) of the transmission electron microscope 500. Further, a position Pb of the specimen, illustrated in FIG. 38, is set at coordinate X1=+6000 μm, coordinates (X2, Y2)=(0, 0).

Here, the range in which the specimen can be moved by the second moving mechanism 520 is assumed to be ±1000 μm. At this time, as illustrated in FIG. 39, in position Pa, the coordinate X takes a value from −1000 μm to +1000 μm in response to an operation of the second moving mechanism 520. Further, in position Pb, the coordinate X takes a value from +5000 μm to +7000 μm in response to an operation of the second moving mechanism 520.

Hence, position coordinates in the coordinate system (X, Y) of the transmission electron microscope 500 can be expressed in a form obtained by adding together the position coordinates in the coordinate system (X2, Y2) of the second moving mechanism 520 and the position coordinate in the coordinate system X1 of the first moving mechanism 512.

Note that in the above description, the coordinates of position Pa were set as the origin of the coordinate system (X, Y) of the transmission electron microscope 500, but the origin of the coordinate system (X, Y) of the transmission electron microscope 500 may be set in any desired position.

Figure 40:
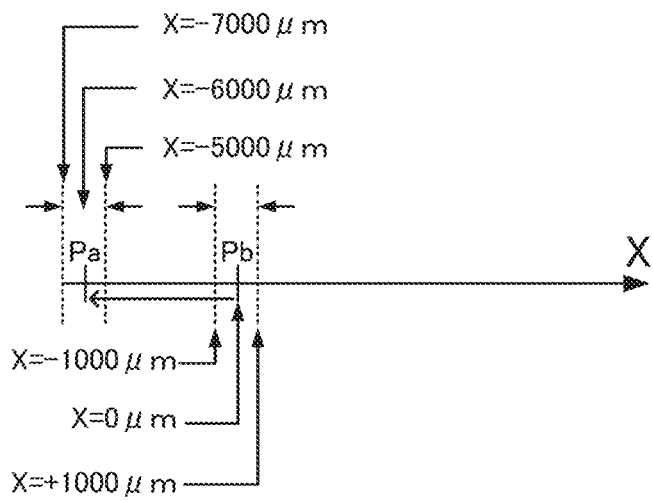
FIG. 40 is a diagram illustrating a case in which a position Pb is set as the origin of the coordinate system (X, Y) of the transmission electron microscope.

FIG. 40 is a diagram illustrating a case in which position Pb illustrated in FIG. 38 is set as the origin of the coordinate system (X, Y) of the transmission electron microscope 500.

In the example illustrated in FIG. 40, in which position Pb illustrated in FIG. 38 is set as the origin of the coordinate system (X, Y) of the transmission electron microscope 500, the coordinate X takes a value from −1000 μm to +1000 μm in response to an operation of the second moving mechanism 520. Further, in position Pa illustrated in FIG. 37, the coordinate X takes a value from −7000 μm to −5000 μm in response to an operation of the second moving mechanism 520.

In the transmission electron microscope 500, as illustrated in FIGS. 39 and 40, the amount by which the first moving mechanism 512 moves the specimen can be set to be larger than the range in which the specimen can be moved by the second moving mechanism 520. In this case, even when the specimen is moved by operating the first moving mechanism 512, the range in which the specimen can be moved by the second moving mechanism 520 before being moved does not cover the range in which the specimen can be moved by the second moving mechanism 520 after being moved. Therefore, by adding together the coordinate system (X2, Y2) of the second moving mechanism 520 and the coordinate system X1 of the first moving mechanism 512, the position coordinates of the specimen can be specified univocally.

However, when the amount by which the first moving mechanism 512 moves the specimen is set to be larger than the range in which the specimen can be moved by the second moving mechanism 520, as described above, images cannot be captured continuously over a larger range than the range in which the specimen can be moved by the second moving mechanism 520.

Therefore, in the transmission electron microscope 500, the amount by which the first moving mechanism 512 moves the specimen can also be set to be smaller than the range in which the specimen can be moved by the second moving mechanism 520. In this case, when the specimen is moved by operating the first moving mechanism 512, the range in which the specimen can be moved by the second moving mechanism 520 before being moved may cover the range in which the specimen can be moved by the second moving mechanism 520 after being moved. The coordinate system in this case will be described below.

2.2.2. Second Method

Figure 41:
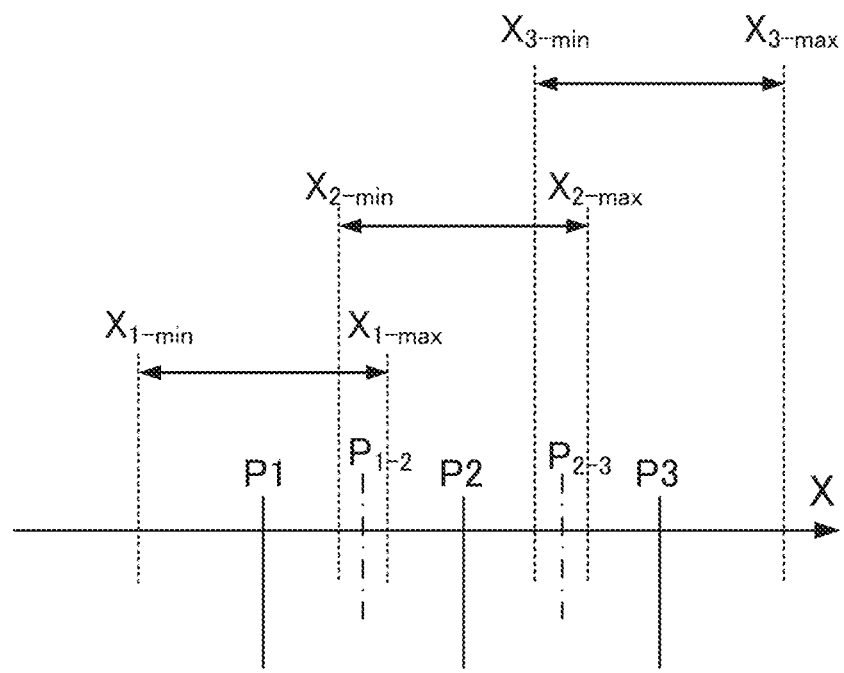
FIG. 41 is a diagram illustrating the coordinate system of the transmission electron microscope.

FIG. 41 is a diagram illustrating the coordinate system of the transmission electron microscope. Note that in the example illustrated in FIG. 41, the amount by which the first moving mechanism 512 moves the specimen is set at 1600 μm. Further, the range in which the specimen can be moved by the second moving mechanism 520 is set at ±1000 μm.

A position P1 illustrated in FIG. 41 is set at coordinate X1=0, coordinate X2=0. In other words, position P1 is set at coordinate X=0 (the origin). At this time, the coordinate X takes a value from −1000 μm to +1000 μm in response to an operation of the second moving mechanism 520. In other words, in position P1, a minimum value $X_{1\_min}$ of the coordinate X=−1000 μm and a maximum value $X_{1\_max}$ of the coordinate X=+1000 μm.

In a position P2, which is reached when the specimen is moved 1600 μm from position P1 by the first moving mechanism 512, the coordinate X1=+1600 μm and the coordinate X2=0. In other words, in position P2, the coordinate X=+1600 μm. At this time, the coordinate X takes a value from +600 μm to +2600 μm in response to an operation of the second moving mechanism 520. In other words, in position P2, a minimum value $X_{2\_min}$ of the coordinate X=+600 μm and a maximum value $X_{2\_max}$ of the coordinate X=+2600 μm.

In a position P3, which is reached when the specimen is moved 1600 μm from position P2 by the first moving mechanism 512, the coordinate X1=+3200 μm and the coordinate X2=0. In other words, in position P3, the coordinate X=+3200 μm. At this time, the coordinate X takes a value from +2200 μm to +4200 μm in response to an operation of the second moving mechanism 520. In other words, in position P3, a minimum value $X_{3\_min}$ of the coordinate X=+2200 μm and a maximum value $X_{3\_max}$ of the coordinate X=+4200 μm.

Here, when the specimen is moved +800 μm from position P1 and when the specimen is moved −800 μm from position P2 using the second moving mechanism 520, the specimen is ideally positioned in the same position $P_{1-2}$ (X=+800 μm). Similarly, when the specimen is moved +800 μm from position P2 and when the specimen is moved −800 μm from position P3, the specimen is ideally positioned in the same position $P_{2-3}$ (X=+2400 μm).

Coordinates obtained when the first moving mechanism 512 and the second moving mechanism 520 operate ideally are indicated on the following table. Note that $X_0$ indicates the coordinate X in positions P1, P2, and P3 when the coordinate X2=0. Further, $X_{-800}$ indicates the coordinate X when the specimen is moved −800 μm from $X_0$ using the second moving mechanism 520, and $X_{+800}$ indicates the coordinate X when the specimen is moved +800 μm from $X_0$ using the second moving mechanism 520.

TABLE 1

| Position | $X_{min}$ | $X_{-800}$ | $X_0$ | $X_{+800}$ | $X_{max}$ |
|---|---|---|---|---|---|
| P1 | −1000 | −800 | 0 | +800 | +1000 |
| P2 | +600 | +800 | +1600 | +2400 | +2600 |
| P3 | +2200 | +2400 | +3200 | +4000 | +4200 |

In actuality, however, due to backlash and the like in the motor of the first moving mechanism 512, an error may occur between $X_{+800}=+800$ in position P1 and $X_{-800}=+800$ in position P2, for example. Similarly, an error may occur between $X_{+800}=+2400$ in position P2 and $X_{-800}=+2400$ in position P3. When an error of this type occurs, a problem arises in that either the field differs even though the coordinate X is identical or the coordinate X differs even through the field is identical. A method for correcting this error will be described below.

2.2.3. Error Correction Method

Figure 42:
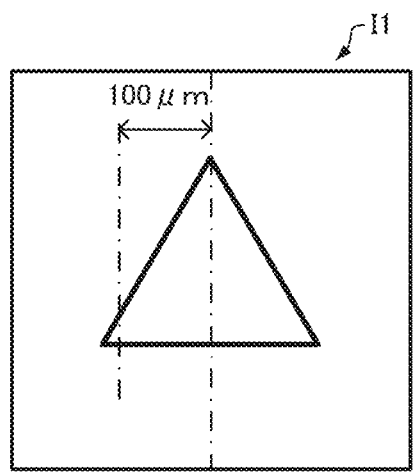
FIG. 42 is a diagram illustrating a coordinate error caused by an operation of a first moving mechanism.
Figure 43:
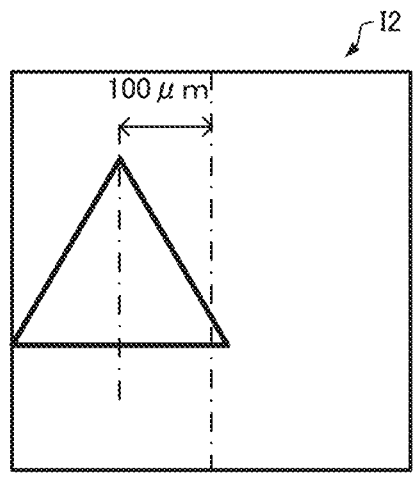
FIG. 43 is a diagram illustrating a coordinate error caused by an operation of the first moving mechanism.

FIGS. 42 and 43 are diagrams illustrating coordinate errors caused by the operation of the first moving mechanism 512. FIG. 42 is an image I1 obtained when the specimen is moved +800 μm from position P1 by an operation of the second moving mechanism 520, and FIG. 43 is an image I2 obtained when the specimen is moved −800 μm from position P2 by an operation of the first moving mechanism 512. It is clear from a comparison of the image I1 and the image I2 that when position P1 is set as a reference, the coordinate of $X_0$ in position P2 deviates by −100 μm. This error is expressed as an error $\delta_{1-2}=-100$ μm.

Figure 44:
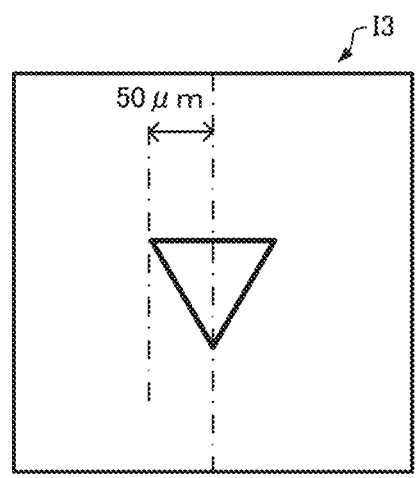
FIG. 44 is a diagram illustrating a coordinate error caused by an operation of the first moving mechanism.
Figure 45:
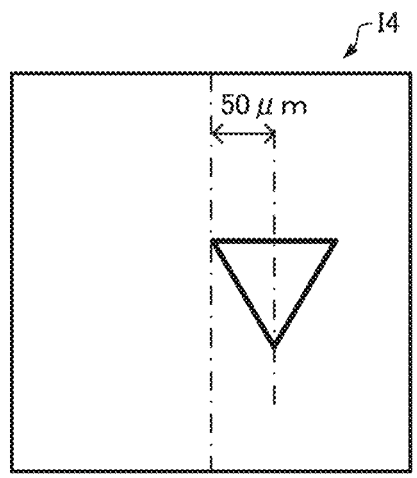
FIG. 45 is a diagram illustrating a coordinate error caused by an operation of the first moving mechanism.

FIGS. 44 and 45 are diagrams illustrating coordinate errors caused by the operation of the first moving mechanism 512. FIG. 44 is an image I3 obtained when the specimen is moved +800 μm from position P2 by an operation of the second moving mechanism 520, and FIG. 45 is an image I4 obtained when the specimen is moved −800 μm from position P3 by an operation of the second moving mechanism 520. It is clear from a comparison of the image I3 and the image I4 that when position P2 is set as a reference, the coordinate of $X_0$ in position P3 deviates by +50 μm. This error is expressed as an error $\delta_{2-3}=+50$ μm.

A table obtained by correcting the above errors $\delta_{1-2}$ and $\delta_{2-3}$ on Table 1 is illustrated below.

TABLE 2

| Position | $X_{min}$ | $X_{-800}$ | $X_0$ | $X_{+800}$ | $X_{max}$ |
|---|---|---|---|---|---|
| P1 | −1000 | −800 | 0 | +800 | +1000 |
| P2 | +500 | +700 | +1500 | +2300 | +2500 |
| P3 | +2150 | +2350 | +3150 | +3950 | +4150 |

By specifying the position coordinates of the specimen using Table 2, the coordinate X can be set univocally, and as a result, the problem in which either the field differs even though the coordinate X is identical or the coordinate X differs even through the field is identical does not occur.

The error δ can be measured using the following method, for example.

When the amount of deviation between the image I1 and the image I2 illustrated in FIGS. 42 and 43 is set as $D_{I1-I2}$, the coordinate of $X_0$ in position P1 is set as $X_{P1}$, the amount by which the second moving mechanism 520 moves the specimen from position P1 when capturing the image I1 is set as $dx_1$, the amount by which the first moving mechanism 512 moves the specimen (prior to correction) is set as Δ, and the amount by which the second moving mechanism 520 moves the specimen when capturing the image I2 is set as $dx_2$, the error $\delta_{1\text{-}2}$ in the amount by which the first moving mechanism 512 moves the specimen is expressed as follows.

$$X_{P1}+dx_1=X_{P1}+\Delta+\delta_{1\text{-}2}+dx_2+D_{11\text{-}12}$$

$$\delta_{1\text{-}2}=dx_1-dx_2+\Delta-D_{11\text{-}12}$$

The amount by which the first moving mechanism 512 moves the specimen can be corrected using the error $\delta_{1\text{-}2}$ determined in the manner described above as a correction amount.

In the transmission electron microscope 500, error correction information (see Table 2) for correcting the position coordinates of the specimen is stored in the storage unit 560. The control unit 530 obtains information indicating the movement amounts of the first moving mechanism 512 and the second moving mechanism 520 and specifies the position coordinates of the specimen by correcting the position coordinates of the specimen specified from the movement amount information using the error correction information. The control unit 530 then executes control to display the specified position coordinates of the specimen on the display unit 550.

For example, when the specimen is moved +800 μm from position P1 by an operation of the second moving mechanism 520, the coordinate X is assumed to be coordinate X=+800 μm. Further, when the specimen is moved −800 μm from position P2 by an operation of the second moving mechanism 520, the coordinate X is assumed to be coordinate X=+700 μm.

2.3. Method for Controlling Moving Mechanisms

As illustrated in FIG. 33, the first moving mechanism 512 converts the rotation of the motor 513 into a linear motion using the spline 514, and therefore backlash may occur. When backlash occurs, the specimen does not move even though the motor 513 is rotating such that the coordinates vary. In the transmission electron microscope 500, to avoid this problem, the control unit 530 may control the first moving mechanism 512 so that the specimen is always moved in the same direction until positioned in a target position. In so doing, backlash can be reduced, enabling an improvement in positional reproducibility.

For example, when moving the specimen to a target position, the control unit 530 moves the specimen to the target position by moving the specimen lastly in a +X direction. When the specimen illustrated in FIG. 41 is moved from position P3 to position P2, for example, the specimen is moved from position P3 to position P1 and then moved to position P2. Further, when the specimen is moved from position P2 to position P1, for example, the specimen is first moved in a −X direction beyond position P1 and then moved to position P1.

2.4. Function for Controlling Position of Specimen Holder when Replacing Specimen The transmission electron microscope 500 includes a mechanism for operating the first moving mechanism 512 even when the specimen holder 510 is not loaded into the transmission electron microscope 500.

For example, when the retainer 200 is attached to the holding base 400, the holding base 400 is preferably in an exposed position, as illustrated in FIG. 38. Therefore, when the specimen holder 510 is not loaded into the transmission electron microscope 500, the first moving mechanism 512 is operated using the function described above so as to position the holding base 400 in an exposed position.

Further, if the holding base 400 remains in an exposed position when the specimen holder 510 is loaded into the transmission electron microscope 500, the holding base 400 may interfere with another member of the transmission electron microscope 500. Therefore, before the specimen holder 510 is loaded into the transmission electron microscope 500, the first moving mechanism 512 is operated using the function described above so that the holding base 400 is not exposed.

In the transmission electron microscope 500, if the holding base 400 is exposed such that the overall length of the specimen holder 510 is long when the specimen holder 510 is discharged from the transmission electron microscope 500, the specimen holder 510 may interfere with another member. In the transmission electron microscope 500, therefore, the control unit 530 operates the first moving mechanism 512 so as to minimize the overall length of the specimen holder 510 in response to a specimen holder discharge instruction from the user.

2.5. Features

The transmission electron microscope 500 has the following features, for example.

The transmission electron microscope 500 is used when the same specimen is observed under an optical microscope and a transmission electron microscope, and includes the specimen holder 510 having the first moving mechanism 512 for moving the specimen, the second moving mechanism 520 for moving the specimen by moving the specimen holder 510, and the control unit 530 for controlling the first moving mechanism 512 and the second moving mechanism 520. Further, the first moving mechanism 512 moves the specimen along the X axis, while the second moving mechanism 520 moves the specimen along the X axis and the Y axis. Furthermore, the control unit 530 specifies the position coordinate X of the specimen based on the amount by which the first moving mechanism 512 moves the specimen and the amount by which the second moving mechanism 520 moves the specimen.

In the transmission electron microscope 500, therefore, two moving mechanisms (the first moving mechanism 512 and the second moving mechanism 520) are provided, and as a result, the observable region of the specimen can be enlarged. With the transmission electron microscope 500, a comparatively large specimen serving as an observation subject can also be observed under an optical microscope, which is effective when the same specimen is observed under an optical microscope and a transmission electron microscope.

The transmission electron microscope 500 includes the storage unit 560 storing the error correction information (see Table 2) for correcting the error that occurs in the position coordinates of the specimen when the specimen is moved by the first moving mechanism 512. Further, when the specimen is moved by the first moving mechanism 512, the control unit 530 corrects the position coordinates of the specimen based on the error correction information. Hence, with the transmission electron microscope 500, the position coordinates of the specimen can be specified accurately.

3. Method for Associating Coordinate System of Optical Microscope with Coordinate System of Transmission Electron Microscope Next, a method for associating the coordinate system of the optical microscope with the coordinate system of the transmission electron microscope will be described.

Figure 46:
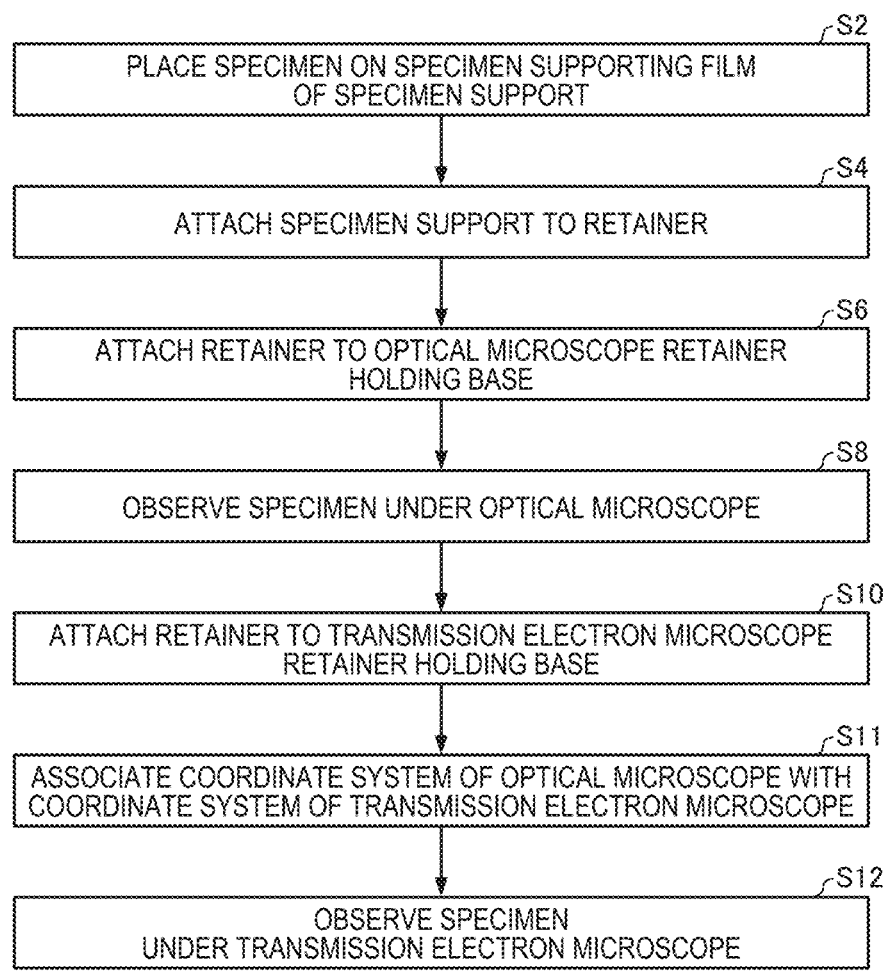
FIG. 46 is a flowchart illustrating another example of the observation method according to one embodiment of the invention.

FIG. 46 is a flowchart illustrating another example of the observation method according to this embodiment. The observation method according to this embodiment includes a step S11 for associating the coordinate system of the optical microscope with the coordinate system of the transmission electron microscope. As a result, an identical location to the location of the specimen observed under the optical microscope can be observed under the transmission electron microscope, for example. Note that in the example illustrated in FIG. 46, step S11 for associating the coordinate systems is performed before step S12 for observing the specimen under the transmission electron microscope, but step S11 may be performed after step S12 for observing the specimen under the transmission electron microscope, for example.

Figure 47:
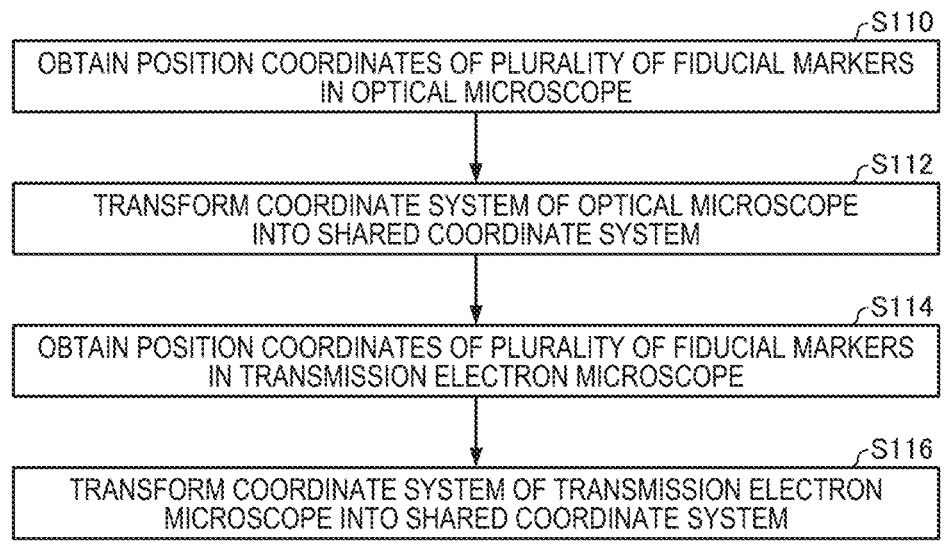
FIG. 47 is a flowchart illustrating an example of a process for associating a coordinate system of an optical microscope with the coordinate system of the transmission electron microscope.
Figure 48:
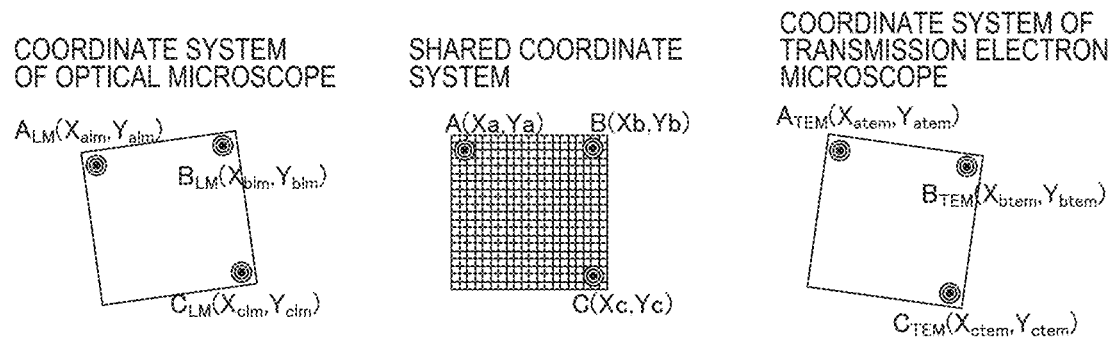
FIG. 48 is a schematic view illustrating the coordinate system of the optical microscope, a shared coordinate system, and the coordinate system of the transmission electron microscope.

FIG. 47 is a flowchart illustrating an example of step S11 for associating the coordinate system of the optical microscope with the coordinate system of the transmission electron microscope. FIG. 48 is a schematic view illustrating the coordinate system of the optical microscope, a shared coordinate system, and the coordinate system of the transmission electron microscope. The position coordinates of the three fiducial markers 106 (see FIG. 2) of the specimen support 100 are described on each of the coordinate systems illustrated in FIG. 48.

Step S11 for associating the coordinate system of the optical microscope with the coordinate system of the transmission electron microscope includes a step S110 for obtaining the position coordinates of the plurality of fiducial markers 106 in the optical microscope, a step S112 for transforming the coordinate system of the optical microscope into the shared coordinate system by matching the position coordinates of the plurality of fiducial markers 106 in the optical microscope with position coordinates of the plurality of fiducial markers 106 in the shared coordinate system, a step S114 for obtaining the position coordinates of the plurality of fiducial markers 106 in the transmission electron microscope, and a step S116 for transforming the coordinate system of the transmission electron microscope into the shared coordinate system by matching the position coordinates of the plurality of fiducial markers 106 in the transmission electron microscope with the position coordinates of the plurality of fiducial markers 106 in the shared coordinate system.

3.1. Obtaining Position Coordinates of Plurality of Fiducial Markers in Optical Microscope First, the position coordinates of the plurality of fiducial markers 106 in the optical microscope are obtained. This will be described below with reference to FIG. 48.

The optical microscope includes a specimen stage capable of obtaining coordinate information. By observing each of the three fiducial markers 106 under the optical microscope, the position coordinates of the three fiducial markers 106 in the coordinate system of the optical microscope can be obtained.

In the optical microscope, data indicating the position coordinates of the three fiducial markers 106 in the optical microscope are output in the form of a text file together with information such as the apparatus name, the type of the object lens, the observation magnification, and the scale (µm/pixel). At this time, images of the fiducial markers 106 photographed by the optical microscope may be output together with the text file.

3.2. Transforming Coordinate System of Optical Microscope into Shared Coordinate System Next, the coordinate system of the optical microscope is transformed into the shared coordinate system. Transformation into the shared coordinate system is achieved by matching the position coordinates of the plurality of fiducial markers 106 in the optical microscope with the position coordinates of the plurality of fiducial markers 106 in the shared coordinate system. Here, the shared coordinate system is a coordinate system used to associate the coordinate system of the optical microscope with the coordinate system of the transmission electron microscope. The coordinate system of the optical microscope and the coordinate system of the transmission electron microscope can coexist in the shared coordinate system.

The plurality of fiducial markers 106 have known intervals and a known arrangement, and therefore the coordinate system of the optical microscope and the shared coordinate system can be correlated using linear transformation. The position coordinates of the fiducial markers in the shared coordinate system are determined from the intervals and arrangement of the actual fiducial markers 106.

A case using two fiducial markers $A_{LM}$, $B_{LM}$ illustrated in FIG. 48, for example, will be described. In the coordinate system of the optical microscope, the position coordinates of the fiducial marker $A_{LM}$ are assumed to be $A_{LM}(X_{alm}, Y_{alm})$, and the position coordinates of the fiducial marker $B_{LM}$ are assumed to be $B_{LM}(X_{blm}, Y_{blm})$. Further, in the shared coordinate system, the position coordinates of a fiducial marker A are assumed to be A (Xa, Ya), and the position coordinates of a fiducial marker B are assumed to be B (Xb, Yb).

In this case, for example, A (Xa, Ya) is matched with $A_{LM}(X_{alm}, Y_{alm})$, whereupon B (Xb, Yb) is matched with $B_{LM}(X_{blm}, Y_{blm})$ using rotation correction. A correction formula for matching B (Xb, Yb) with $B_{LM}(X_{blm}, Y_{blm})$ is as follows, for example.

$$\begin{pmatrix} Xb \\ Yb \end{pmatrix} = \begin{pmatrix} \cos\theta_{LM} & -\sin\theta_{LM} \\ \sin\theta_{LM} & \cos\theta_{LM} \end{pmatrix} \begin{pmatrix} X_{blm} \\ Y_{blm} \end{pmatrix}$$

3.3. Obtaining Position Coordinates of Plurality of Fiducial Markers in Transmission Electron Microscope Next, the position coordinates of the plurality of fiducial markers 106 in the transmission electron microscope are obtained. The position coordinates of the specimen in the coordinate system of the transmission electron microscope can be obtained by observing each of the three fiducial markers 106 under the transmission electron microscope 500. In the transmission electron microscope 500, the control unit 530 executes processing for specifying the position coordinates of the specimen.

3.4. Transforming Coordinate System of Transmission Electron Microscope into Shared Coordinate System Next, the coordinate system of the transmission electron microscope is transformed into the shared coordinate system. Similarly to the coordinate system of the optical microscope, transformation into the shared coordinate system is achieved by matching the position coordinates of the plurality of fiducial markers 106 in the transmission electron microscope with the position coordinates of the plurality of fiducial markers 106 in the shared coordinate system.

A case using two fiducial markers $A_{TEM}$, $B_{TEM}$ illustrated in FIG. 48, for example, will be described. In the coordinate system of the transmission electron microscope, the position coordinates of the fiducial marker $A_{TEM}$ are assumed to be $A_{TEM}(X_{atem}, Y_{atem})$, and the position coordinates of the fiducial marker $B_{TEM}$ are assumed to be $B_{TEM}(X_{btem}, Y_{btem})$. Further, in the shared coordinate system, the position coordinates of the fiducial marker A are assumed to be A (Xa, Ya), and the position coordinates of the fiducial marker B are assumed to be B (Xb, Yb).

In this case, for example, A (Xa, Ya) is matched with $A_{TEM}(X_{atem}, Y_{atem})$, whereupon B (Xb, Yb) is matched with $B_{TEM}$ ($X_{btem}$, $Y_{btem}$) using rotation correction. A correction formula for matching B (Xb, Yb) with $B_{TEM}$ ($X_{btem}$, $Y_{btem}$) is as follows, for example.

$$\begin{pmatrix} Xb \\ Yb \end{pmatrix} = \begin{pmatrix} \cos\theta_{TEM} & -\sin\theta_{TEM} \\ \sin\theta_{TEM} & \cos\theta_{TEM} \end{pmatrix} \begin{pmatrix} X_{btem} \\ Y_{btem} \end{pmatrix}$$

By executing the processes described above, the position coordinates of the optical microscope can be associated with the position coordinates of the transmission electron microscope.

Note that here, a case in which the position coordinates of the optical microscope and the position coordinates of the transmission electron microscope are associated by matching the coordinates of two fiducial markers 106 was described, but the coordinates of three or more fiducial markers 106 may be matched instead. For example, by using three of more fiducial markers 106, the front and rear of the specimen can be specified.

Note that when coordinate information cannot be obtained from the optical microscope, for example, the coordinate system of the optical microscope can be transformed into a reference coordinate system using an image captured by the optical microscope. More specifically, an image including at least two fiducial markers 106 and calibration data relating to the image (for example, information (μm/pixel) indicating the length per pixel) are used. In so doing, the coordinate system of the optical microscope can be transformed into a reference coordinate system by a similar method to the method described above for transforming the coordinate system of the optical microscope into a reference coordinate system.

This applies likewise to the transmission electron microscope, and accordingly, the coordinate system of the transmission electron microscope can be transformed into a reference coordinate system using an image captured by the transmission electron microscope and calibration data. Note that a montage or the like may be used to obtain an image including at least two fiducial markers 106.

Further, a case in which the coordinate system of the optical microscope and the coordinate system of the transmission electron microscope are associated via a reference coordinate system was described above, but the coordinate system of the optical microscope and the coordinate system of the transmission electron microscope may be associated directly.

Furthermore, a case in which two fiducial markers 106 are used was described above, but the coordinate system of the optical microscope and the coordinate system of the transmission electron microscope may be associated using three fiducial markers 106. When three fiducial markers 106 are used, coordinate information is obtained in relation to three points, and therefore affine transformation can be employed. By employing affine transformation, warping of an image captured by the optical microscope and an image captured by the transmission electron microscope can be corrected when such warping occurs.

3.5. Features

In the observation method according to this embodiment, as described above, the coordinate system of the optical microscope and the coordinate system of the transmission electron microscope are associated using a shared coordinate system. This is particularly effective when, for example, the coordinate system of a single optical microscope is associated with the coordinate systems of a plurality of transmission electron microscopes or the coordinate systems of a plurality of optical microscopes are associated with the coordinate systems of a plurality of transmission electron microscopes.

The above-described embodiments and modifications are examples and the invention is not limited thereto. For example, the embodiments and the modifications may be combined appropriately.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:

1. An observation method comprising:
    placing a specimen on a specimen supporting film of a specimen support;
    attaching the specimen support to a retainer;
    attaching the retainer to an optical microscope retainer holding base;
    attaching the optical microscope retainer holding base to a specimen stage of an optical microscope and observing the specimen under the optical microscope;
    attaching the retainer to a transmission electron microscope retainer holding base; and
    loading the transmission electron microscope retainer holding base into a transmission electron microscope and observing the specimen under the transmission electron microscope,
    wherein the transmission electron microscope includes a specimen holder provided with the transmission electron microscope retainer holding base,
    the specimen holder includes a first moving mechanism within the specimen holder for moving the specimen, and
    the first moving mechanism moves the specimen by moving the transmission electron microscope retainer holding base, and
    wherein the transmission electron microscope includes a second moving mechanism for moving the specimen,
    the second moving mechanism moves the specimen by moving the specimen holder,
    the first moving mechanism moves the specimen along a first axis, and
    the second moving mechanism comprising a first axis moving mechanism mounted on a column of the transmission electron microscope and configured to move the specimen holder along the first axis, thereby moving the specimen along the first axis and a second axis moving mechanism mounted on the column of the transmission electron microscope and configured to move the specimen holder along a second axis that is orthogonal to the first axis, thereby moving the specimen along the second axis.

2. The observation method according to claim 1, wherein the specimen support includes:
   a substrate; and
   the specimen supporting film supported by the substrate and formed of a silicon nitride film or a carbon film.

3. The observation method according to claim 2, wherein a through hole is provided in the substrate, and
   a fiducial marker provided in a region of the specimen supporting film that covers the through hole, the fiducial marker being observable under the optical microscope and the transmission electron microscope.

4. The observation method according to claim 3, wherein the fiducial marker has a shape in which a plurality of similar figures are arranged concentrically.

5. The observation method according to claim 3, wherein three fiducial markers are provided, and
   a figure formed by connecting respective centers of the three fiducial markers with straight lines is a right-angled triangle.

6. The observation method according to claim 3, wherein the fiducial marker is provided in a plurality, and
   the plurality of fiducial markers have identical shapes but are disposed in different orientations.

7. The observation method according to claim 1, wherein a recessed portion or a through hole is provided in the optical microscope retainer holding base to prevent interference with an object lens of the optical microscope.

8. The observation method according to claim 1, wherein the optical microscope retainer holding base includes a placement surface on which the retainer is placed, and
   a front surface side and a rear surface side of the retainer can both be placed on the placement surface.

9. The observation method according to claim 1, wherein the transmission electron microscope includes a control unit that controls the first moving mechanism and the second moving mechanism, and
   the control unit specifies position coordinates of the specimen under the transmission electron microscope based on an amount by which the first moving mechanism moves the specimen and an amount by which the second moving mechanism moves the specimen.

10. The observation method according to claim 9, wherein the transmission electron microscope includes a storage unit that stores error correction information for correcting an error that occurs in the position coordinates of the specimen when the specimen is moved by the first moving mechanism, and
    when the specimen is moved by the first moving mechanism, the control unit corrects the position coordinates of the specimen based on the error correction information.

11. The observation method according to claim 3, further comprising:
    obtaining position coordinates of the plurality of fiducial markers in the optical microscope;
    transforming a coordinate system of the optical microscope into a shared coordinate system by matching the position coordinates of the plurality of fiducial markers in the optical microscope with position coordinates of the plurality of fiducial markers in the shared coordinate system,
    obtaining position coordinates of the plurality of fiducial markers in the transmission electron microscope; and
    transforming a coordinate system of the transmission electron microscope into the shared coordinate system by matching the position coordinates of the plurality of fiducial markers in the transmission electron microscope with the position coordinates of the plurality of fiducial markers in the shared coordinate system.

12. A specimen support for supporting a specimen when a same specimen is observed under an optical microscope and a transmission electron microscope, the specimen support comprising:
    a substrate provided with a through hole;
    a specimen supporting film supported by the substrate and formed of a silicon nitride film or a carbon film; and
    a fiducial marker provided in a region of the specimen supporting film that covers the through hole, the fiducial marker being observable under the optical microscope and the transmission electron microscope,
    wherein the fiducial marker has a shape in which a plurality of similar symmetrical figures are arranged concentrically.

13. The specimen support according to claim 12, wherein three fiducial markers are provided, and
    a figure formed by connecting respective centers of the three fiducial markers with straight lines is a right-angled triangle.

14. The specimen support according to claim 12, wherein the fiducial marker is provided in a plurality, and
    the plurality of fiducial markers have identical shapes but are disposed in different orientations.

15. A transmission electron microscope used when a same specimen is observed under an optical microscope and the transmission electron microscope, the transmission electron microscope comprising:
    a specimen holder that has a first moving mechanism within the specimen holder for moving the specimen by moving a transmission electron microscope retainer holding base;
    a second moving mechanism that moves the specimen by moving the specimen holder; and
    a control unit that controls the first moving mechanism and the second moving mechanism,
    the first moving mechanism moving the specimen along a first axis;
    the second moving mechanism comprising a first axis moving mechanism mounted on a column of the transmission electron microscope and configured to move the specimen holder along the first axis, thereby moving the specimen along the first axis and a second axis moving mechanism mounted on the column of the transmission electron microscope and configured to move the specimen holder along a second axis that is orthogonal to the first axis, thereby moving the specimen along the second axis; and
    the control unit specifying position coordinates of the specimen under the transmission electron microscope based on an amount by which the first moving mechanism moves the specimen and an amount by which the second moving mechanism moves the specimen.

16. The transmission electron microscope according to claim 15, further comprising a storage unit that stores error correction information for correcting an error that occurs in the position coordinates of the specimen when the specimen is moved by the first moving mechanism,
    wherein, when the specimen is moved by the first moving mechanism, the control unit corrects the position coordinates of the specimen based on the error correction information.

* * * * *